US012813051B2

(12) United States Patent
Lee et al.

(10) Patent No.: US 12,813,051 B2
(45) Date of Patent: Nov. 24, 2026

(54) DISPLAY DEVICE

(71) Applicant: LG Display Co., Ltd., Seoul (KR)

(72) Inventors: Seungjun Lee, Paju-si (KR); Yongseok Kwak, Paju-si (KR); Kiyong Yang, Seoul (KR)

(73) Assignee: LG DISPLAY CO., LTD., Seoul (KR)

( * ) Notice: Subject to any disclaimer, the term of this patent is extended or adjusted under 35 U.S.C. 154(b) by 365 days.

(21) Appl. No.: 18/528,493

(22) Filed: Dec. 4, 2023

(65) Prior Publication Data

US 2024/0258490 A1 Aug. 1, 2024

(30) Foreign Application Priority Data

Jan. 27, 2023 (KR) ........................ 10-2023-0011187

(51) Int. Cl.
*H10H 20/857* (2025.01)
*H10H 29/49* (2025.01)
*H10W 90/00* (2026.01)

(52) U.S. Cl.
CPC .......... *H10H 20/857* (2025.01); *H10H 29/49* (2025.01); *H10W 90/00* (2026.01)

(58) Field of Classification Search
CPC ...... H10H 20/857; H10H 29/49; H10W 90/00
See application file for complete search history.

(56) References Cited

U.S. PATENT DOCUMENTS

2018/0175268 A1* 6/2018 Moon .................. H10H 20/857
2020/0212279 A1* 7/2020 Son ...................... H10H 20/857
2020/0219779 A1 7/2020 Yen
2020/0219863 A1 7/2020 Bibl et al.
2021/0111324 A1 4/2021 Chung et al.

FOREIGN PATENT DOCUMENTS

CN 114464717 A * 5/2022 ........... H10H 20/857
CN 114497111 A 5/2022
EP 2950299 A1 12/2015
KR 10-2015-0139028 A 12/2015
KR 10-2018-0133649 A 12/2018
KR 10-2021-0025216 A 3/2021
KR 10-2021-0043236 A 4/2021
KR 10-2021-0083681 A 7/2021

* cited by examiner

*Primary Examiner* — Peter M Albrecht

(74) *Attorney, Agent, or Firm* — Birch, Stewart, Kolasch & Birch, LLP

(57) ABSTRACT

Discussed is a display device in which when a dark spot defect occurs in a light-emitting element, the defective light-emitting element can be repaired with a new light-emitting element disposed in a repair area. The display device can include a light-emitting element disposed in a first area, and a repair pad disposed in a second area extending from the first area. The light-emitting element includes one side electrode connected to a 1-1 th electrode via a 1-1 th connection line, and another side electrode connected to a second electrode via a second connection line. Further, the repair pad includes a 1-2 th electrode, the second electrode, the second connection line, and a 1-2 th connection line, whereas the second connection line is connected to the second electrode, and the 1-2 th connection line connected to the 1-2 th electrode.

20 Claims, 12 Drawing Sheets

(a)

(b)

(a)

(b)

(a)

(b)

DISPLAY DEVICE

CROSS-REFERENCE TO RELATED APPLICATION

This application claims priority to Korean Patent Application No. 10-2023-0011187, filed in the Republic of Korea on Jan. 27, 2023, the disclosure of which is hereby expressly incorporated by reference in its entirety into the present application.

BACKGROUND

Field

The present disclosure relates to a display device configured to effectively repair any defective light emitting element.

Discussion of Related Art

A display device with a self-light-emitting element can be implemented to be thinner than a display device with a built-in light source, and can be implemented as a flexible and foldable display device.

The display device with the self-light-emitting element includes an organic light-emitting display device including a light-emissive layer made of an organic material, and a micro-light emitting diode (LED) display device using a micro light-emitting diode as a light-emitting element.

While the organic light-emitting display device does not require a separate light source, a defective pixel can occur due to moisture and oxygen. Thus, various technical ideas are additionally needed to minimize penetration of oxygen and moisture.

The micro-LED display device has high definition and high reliability, and thus is in the limelight as a next-generation display device. Further, the micro light-emitting element is a semiconductor light-emitting element which emits light when current flows through a semiconductor, and is widely used in lighting, TV, and various display devices.

SUMMARY OF THE DISCLOSURE

A general micro-LED display device does not have a separate repair pad. Thus, a panel is discarded when a dark spot defect occurs. This causes a material cost to increase.

Accordingly, in order to solve or address the above-mentioned problems and other limitations, the inventors of the present disclosure have invented an improved display device in which when a dark spot defect occurs in a light-emitting element, the defective light-emitting element can be efficiently repaired with a new light-emitting element.

Therefore, a purpose of the present disclosure is to provide a display device in which a repair pad is disposed in an extra space in a pixel and is sealed with a bank, and then when a pixel is determined to have a dark spot upon light-emission inspection, the bank is removed with laser, and a normal (non-defective) light-emitting element is flip-bonded to the repair pad, thereby repairing the dark spot defective pixel.

Purposes according to the present disclosure are not limited to the above-mentioned purpose. Other purposes and advantages according to the present disclosure that are not mentioned can be understood based on following descriptions, and can be more clearly understood based on embodiments according to the present disclosure. Further, it will be easily understood that the purposes and advantages according to the present disclosure can be realized using means shown in the claims or combinations thereof.

A display device according to an aspect of the present disclosure can be provided. The display device can include a light-emitting element disposed in a first area; and a repair pad disposed in a second area extending from the first area, wherein the light-emitting element includes: one side electrode connected to a 1-1 th electrode via a 1-1 th connection line; and the other side electrode (another side electrode) connected to a second electrode via a second connection line, wherein the repair pad includes a 1-2 th electrode, the second electrode, the second connection line, and a 1-2 th connection line, wherein the 1-2 th electrode and the second electrode of the repair pad are disposed in the same layer in a corresponding manner to each other, wherein the second connection line and the 1-2 th connection line of the repair pad are disposed in the same layer in a corresponding manner to each other, wherein the second connection line is connected to the second electrode, and the 1-2 th connection line connected to the 1-2 th electrode, wherein the layer in which the second connection line and the 1-2 th connection line are disposed is different from the layer in which the 1-2 th electrode and the second electrode are disposed.

A display device according to another aspect of the present disclosure can be provided. The display device can include a substrate including a first area and a second area; a first light-emitting element disposed in the first area; a second light-emitting element disposed in the second area; a 1-1 th electrode disposed on the substrate and in the first area; a second electrode disposed on the substrate and in a portion of the first area and a portion of the second area; a 1-2 th electrode disposed on the substrate and in the second area; a 1-1 th connection line connecting one side electrode of the first light-emitting element and the 1-1 th electrode to each other; a second connection line connecting the second electrode to the other side electrode of the first light-emitting element, and connecting the second electrode to one side electrode of the second light-emitting element; and a 1-2 th connection line connecting the 1-2 th electrode and the other side electrode of the second light-emitting element.

A display device according to still another aspect of the present disclosure can be provided. The display device can include a substrate including a first area and a second area; a first light-emitting element disposed in the first area; a second light-emitting element disposed in the second area; a 1-1 th electrode disposed on the substrate and in the first area; a second electrode disposed on the substrate and in a portion of the first area and a portion of the second area; a 1-2 th electrode disposed on the substrate and in the second area; a 1-1 th connection line connecting one side electrode of the first light-emitting element and the 1-1 th electrode to each other; a second connection line connecting the other side electrode (another side electrode) of the first light-emitting element and the second electrode to each other; and a 1-2 th connection line connected to the 1-2 th electrode, wherein one side electrode of the second light-emitting element is connected to the second electrode in the second area; wherein the other side electrode of the second light-emitting element is connected to the 1-2 th electrode in the second area.

A display device according to still yet another aspect of the present disclosure can be provided. The display device can include a substrate including a first area and a second area; a light-emitting element disposed in the first area; a 1-1 th electrode disposed on the substrate and in the first area; a second electrode disposed on the substrate and in a portion of the first area and a portion of the second area; a 1-2 th electrode disposed on the substrate and in the second area; a 1-1 th connection line connected to the 1-1 th electrode; a second connection line connected to the second electrode; and a 1-2 th connection line connected to the 1-2 th electrode, wherein one side electrode of the light-emitting element is connected to the 1-1 th electrode, while the other side electrode (another side electrode) of the light-emitting element is connected to the second electrode.

According to one or more embodiments of the present disclosure, the repair pad used to replace the dark spot defective pixel can be provided in each pixel during a manufacturing of a display panel.

Moreover, according to one or more embodiments of the present disclosure, a light-emission test is conducted on each pixel during the manufacturing of a display panel. When a pixel with a dark spot defect is detected, a normal (e.g., non-defective) light-emitting element can be bonded to the repair pad, thereby repairing the defective pixel.

Moreover, according to one or more embodiments of the present disclosure, the dark spot defective element can be replaced with the new light-emitting element during a panel manufacturing. Thus, the panel does not have to be discarded, and a lifespan of the panel can be improved to realize a long lifespan product.

Moreover, according to one or more embodiments of the present disclosure, the dark spot defective element can be replaced with the new light-emitting element during a panel manufacturing. Thus, the panel does not have to be discarded, such that a material cost can be reduced.

Moreover, according to one or more embodiments of the present disclosure, it is not necessary to open a bank in advance during a panel manufacturing, thereby preventing an increase in reflectance of the product.

Moreover, according to one or more embodiments of the present disclosure, a plurality of repair pads can be disposed during a panel manufacturing. Thus, in preparation for repair failure, multiple repair attempts can be executed.

Further, according to an embodiment of the present disclosure, a display device with a high resolution, a narrow bezel, and low power consumption can be realized using the micro light-emitting element.

In addition to the above effects, specific effects of the present disclosure are described together while describing specific details for carrying out the present disclosure.

Effects of the present disclosure are not limited to the effects mentioned above, and other effects not mentioned will be clearly understood by those skilled in the art from the descriptions below.

BRIEF DESCRIPTION OF THE DRAWINGS

The present disclosure will become more fully understood from the detailed description given hereinbelow and the accompanying drawings which are given by way of illustration only, and thus are not limitative of the present disclosure.

DETAILED DESCRIPTION OF THE EMBODIMENTS

Figure 1:
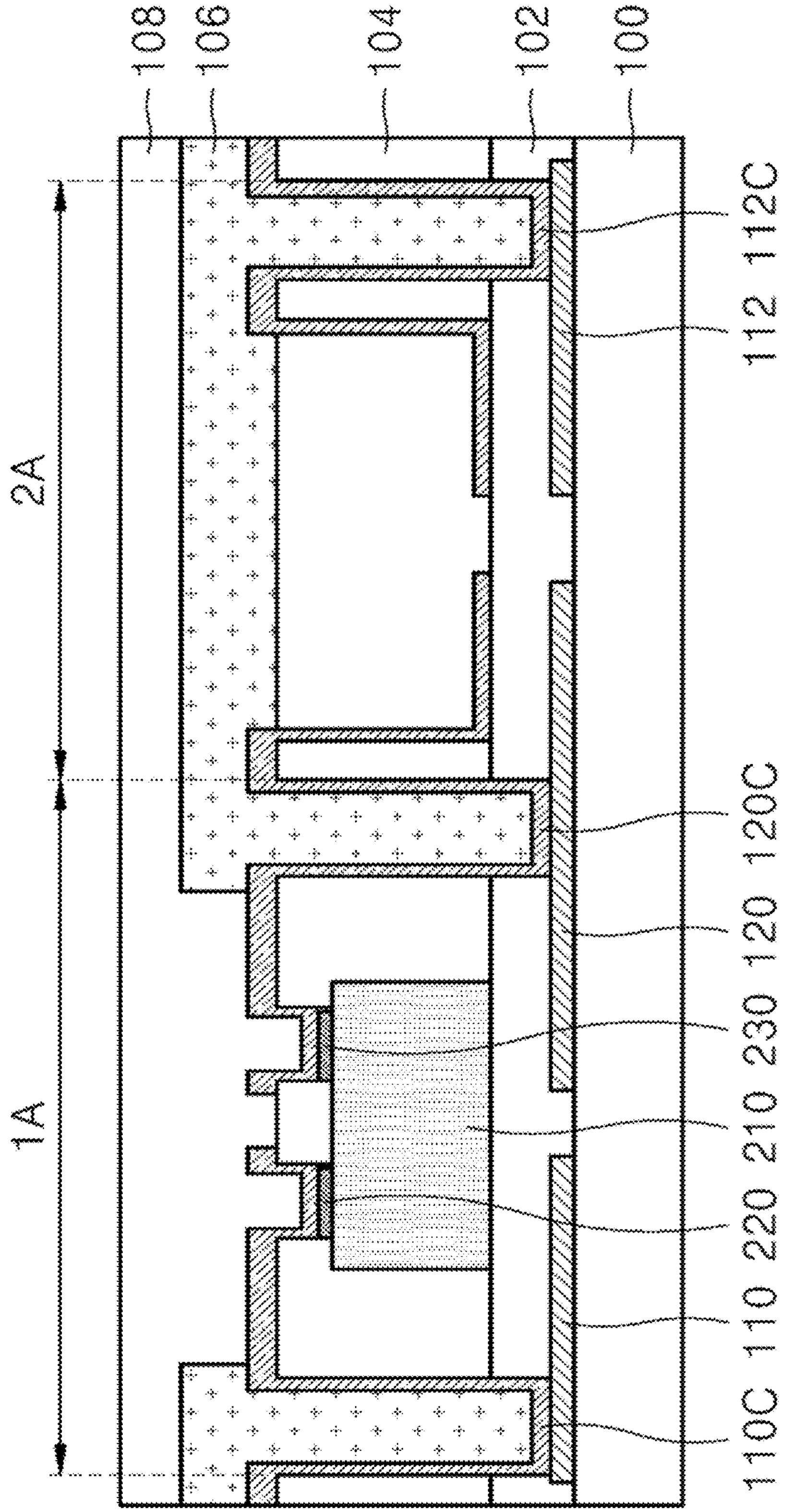
FIG. 1 is a cross-sectional view for illustrating a pixel of a display device according to an embodiment of the present disclosure.

Advantages and features of the present disclosure, and a method of achieving the advantages and features will become apparent with reference to embodiments described later in detail together with the accompanying drawings. However, the present disclosure is not limited to the embodiments as disclosed under, but can be implemented in various different forms. Thus, these embodiments are set forth only to make the present disclosure complete, and to completely inform the scope of the present disclosure to those of ordinary skill in the technical field to which the present disclosure belongs.

For simplicity and clarity of illustration, elements in the drawings are not necessarily drawn to scale. The same reference numbers in different drawings represent the same or similar elements, and as such perform similar functionality. Further, descriptions and details of well-known steps and elements are omitted for simplicity of the description. Furthermore, in the following detailed description of the present disclosure, numerous specific details are set forth in order to provide a thorough understanding of the present disclosure. However, it will be understood that the present disclosure can be practiced without these specific details. In other instances, well-known methods, procedures, components, and circuits have not been described in detail so as not to unnecessarily obscure aspects of the present disclosure. Examples of various embodiments are illustrated and described further below. It will be understood that the description herein is not intended to limit the claims to the specific embodiments described. On the contrary, it is intended to cover alternatives, modifications, and equivalents as can be included within the spirit and scope of the present disclosure as defined by the appended claims.

A shape, a size, a ratio, an angle, a number, etc., disclosed in the drawings for describing embodiments of the present disclosure are illustrative, and the present disclosure is not limited thereto. The same reference numerals refer to the same elements herein.

The terminology used herein is directed to the purpose of describing particular embodiments only and is not intended to be limiting of the present disclosure. As used herein, the singular constitutes “a” and “an” are intended to include the plural constitutes as well, unless the context clearly indicates otherwise. It will be further understood that the terms “comprise”, “comprising”, “include”, and “including” when used in this specification, specify the presence of the stated features, integers, operations, elements, and/or components, but do not preclude the presence or addition of one or more other features, integers, operations, elements, components, and/or portions thereof. As used herein, the term “and/or” includes any and all combinations of one or more of associated listed items. Expression such as “at least one of” when being immediately adjacent to a list of elements can modify the entire list of elements and may not modify the individual elements of the list. In interpretation of numerical values, an error or tolerance therein can occur even when there is no explicit description thereof.

In addition, it will also be understood that when a first element or layer is referred to as being present “on” or “over” a second element or layer, the first element or layer can be disposed directly on the second element or layer, or can be disposed indirectly on the second element or layer with one or more third elements or layers being disposed between the first and second elements or layers. It will be understood that when an element or layer is referred to as being “connected to”, or “coupled to” another element or layer, it can be directly on, connected to, or coupled to the other element or layer, or one or more intervening elements or layers can be present. In addition, it will also be understood that when an element or layer is referred to as being “between” two elements or layers, it can be the only element or layer between the two elements or layers, or one or more intervening elements or layers can also be present.

Further, as used herein, when a layer, film, region, plate, or the like is disposed “on” or “on a top” of another layer, film, region, plate, or the like, the former can directly contact the latter or still one or more other layer(s), film(s), region (s), plate(s), or the like can be disposed between the former and the latter. As used herein, when a layer, film, region, plate, or the like is directly disposed “on” or “on a top” of another layer, film, region, plate, or the like, the former directly contacts the latter and still another layer, film, region, plate, or the like is not disposed between the former and the latter. Further, as used herein, when a layer, film, region, plate, or the like is disposed “below” or “under” another layer, film, region, plate, or the like, the former can directly contact the latter or still one or more other layer(s), film, region(s), plate(s), or the like can be disposed between the former and the latter. As used herein, when a layer, film, region, plate, or the like is directly disposed “below” or “under” another layer, film, region, plate, or the like, the former directly contacts the latter and still another layer, film, region, plate, or the like is not disposed between the former and the latter.

In descriptions of temporal relationships, for example, temporal precedent relationships between two events such as “after”, “subsequent to”, “before”, etc., another event can occur therebetween unless “directly after”, “directly subsequent” or “directly before” is indicated.

When a certain embodiment can be implemented differently, a function or an operation specified in a specific block can occur in a different order from an order specified in a flowchart. For example, two blocks in succession can be actually performed substantially concurrently, or the two blocks can be performed in a reverse order depending on a function or operation involved.

It will be understood that, although the terms “first”, “second”, “third”, and so on can be used herein to describe various elements, components, regions, layers and/or sections, these elements, components, regions, layers and/or sections should not be limited by these terms. These terms are used to distinguish one element, component, region, layer or section from another element, component, region, layer or section, and may not define order or sequence. Thus, a first element, component, region, layer or section described under could be termed a second element, component, region, layer or section, without departing from the spirit and scope of the present disclosure.

The features of the various embodiments of the present disclosure can be partially or entirely combined with each other, and can be technically associated with each other or operate with each other. The embodiments can be implemented independently of each other and can be implemented together in an association relationship.

In interpreting a numerical value, the value is interpreted as including an error range unless there is separate explicit description thereof.

Unless otherwise defined, all terms including technical and scientific terms used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

As used herein, “embodiments,” “examples,” “aspects”, and the like should not be construed such that any aspect or design as described is superior to or advantageous over other aspects or designs.

Further, the term ‘or’ means ‘inclusive or’ rather than ‘exclusive or’. For example, unless otherwise stated or clear from the context, the expression that ‘x uses a or b’ means any one of natural inclusive permutations.

The terms used in the description below have been selected as being general and universal in the related technical field. However, there can be other terms than the terms depending on the development and/or change of technology, convention, preference of technicians, etc. Therefore, the terms used in the description below should not be understood as limiting technical ideas, but should be understood as examples of the terms for describing embodiments.

Further, in a specific case, a term can be arbitrarily selected by the applicant, and in this case, the detailed meaning thereof will be described in a corresponding description section. Therefore, the terms used in the description below should be understood based on not simply the name of the terms, but the meaning of the terms and the contents throughout the Detailed Descriptions.

Hereinafter, a display device according to an embodiment of the present disclosure will be described. All the components of each display device according to all embodiments of the present disclosure are operatively coupled and configured.

FIG. 1 is a cross-sectional view for illustrating a pixel of a display device according to an embodiment of the present disclosure.

Referring to FIG. 1, the display device according to an embodiment of the present disclosure includes a light-emitting element 210 disposed in a first area 1A; and a repair pad 112, 112C, 120, and 120C disposed in a second area 2A extending from the first area 1A.

According to an embodiment of the present disclosure, for example, the first area 1A includes a display area or an active area, and the second area 2A can include a repair area.

The light-emitting element 210 can have one side electrode 220 connected to a 1-1 th electrode 110 via a 1-1 th connection line 110C, and the other side electrode 230 (or another side electrode 230) connected to a second electrode 120 via a second connection line 120C. In this and other embodiments of the present disclosure, the one side electrode and the other side electrode can be referred to as one side electrode and another side electrode, respectively.

The repair pad 112, 112C, 120, and 120C includes a 1-2 th electrode 112, the second electrode 120, the second connection line 120C, and a 1-2 th connection line 112C. The 1-2 th electrode 112 and the second electrode 120 of the repair pad 112, 112C, 120, and 120C can be disposed in the same layer. The second connection line 120C and the 1-2 th connection line 112C of the repair pad 112, 112C, 120, and 120C can be disposed in the same layer different from the layer in which the 1-2 th electrode 112 and the second electrode 120 are disposed. The second connection line 120C is connected to the second electrode 120, while the 1-2 th connection line 112C is connected to the 1-2 th electrode 112.

The 1-1 th connection line 110C has one side connected to the 1-1 th electrode 110, and the other side (another side) connected to one side electrode 220 of the light-emitting element 210.

The second connection line 120C has one of both opposite sides connected to the other side electrode 230 of the light-emitting element 210 in the first area 1A, a middle portion connected to the second electrode 120, and the other of the both opposite sides disposed in the second area 2A.

The 1-2 th connection line 112C has one side connected to the 1-2 th electrode 112 and the other side disposed in a different layer from a layer in which one side is disposed.

The 1-1 th connection line 110C, the 1-2 th connection line 112C, and the second connection line 120C can be made of the same material. For example, the 1-1 th connection line 110C, the 1-2 th connection line 112C and the second connection line 120C can be made of transparent metal oxide or transparent conductive material such as indium-tin-oxide (ITO), or indium-zinc-oxide (IZO).

In the display device according to an embodiment of the present disclosure, at least one pixel can have a following stack structure.

A substrate 100 includes the first area 1A and the second area 2A. The 1-1 th electrode 110 can be disposed on the substrate 100 and in the first area 1A. The 1-2 th electrode 112 can be disposed on the substrate and in the second area 2A.

In this regard, the 1-1 th electrode 110 and the 1-2 th electrode 112 can be, for example, an anode electrode. The 1-1 th electrode 110 and the 1-2 th electrode 112 can be electrically connected to each other. The 1-1 th electrode 110 and the 1-2 th electrode 112 are shown as separate electrodes in FIG. 1. However, the present disclosure is not limited thereto and the 1-1 th electrode 110 and the 1-2 th electrode 112 can be integrally formed.

The substrate 100 can refer to a panel substrate. The panel substrate SUB can include a first optical functional layer and a second optical functional layer.

The first optical functional layer can serve to prevent transmission and reflection of light. The first optical functional layer can include a material that absorbs light. For example, the first optical functional layer can include carbon black, black titanium oxide or black iron oxide. Moreover, the first optical functional layer can be formed by adding micro porous zeolite to the light absorbing material. The porous zeolite has a plurality of pores. Accordingly, the plurality of pores can absorb moisture invading from an interface, and thus can prevent the moisture from penetrating into an inside of the display device.

The second optical functional layer can include a first pattern and a second pattern. The first pattern can have a first thickness, and the second pattern can have a second thickness relatively smaller than the first pattern. Accordingly, the second optical functional layer can have a stepped shape. The first patterns and the second patterns can be alternately arranged with each other and can be disposed on the panel substrate SUB.

The first pattern of the second optical functional layer has adhesiveness. Due to this adhesiveness, the light-emitting element 210 can be fixed onto the panel substrate SUB. The second pattern may not be adhesive. Thus, the light-emitting element 210 is not attached thereto. Accordingly, the light-emitting element 210 is transferred only onto the first pattern having the adhesiveness, and thus can be accurately transferred to a target position.

The second optical functional layer can be composed of an adhesive compound whose adhesiveness is removed by irradiating light thereto. In this regard, the adhesive compound can contain a tackifier, a compound, a photo acid generator (PAG), and a quencher. In this regard, the quencher can include a material that neutralizes an acid produced from the photo acid generator (PAG). In one example, the quencher can include a basic material. For example, the quencher can include an amine-based material and a pyridine-based material. When the quencher is made of the amine-based material, the quencher can include tri(n-octyl)amine or hydroxylamine. When the quencher is made of the pyridine-based material, the quencher can include 2-benzyl pyridine, 4,4'-diphenyl-2, 2'-dipyridyl, 4-dimethylaminopyridine, and 1,3-di(4-pyridyl)propane.

Moreover, the tackifier can contain a foaming agent, an antioxidant, a dendrimer, and a photoactive resin. In this regard, the photoactive resin can include novolac resin. The compound can include an alkali developable binder, a silicon (Si)-based binder, a photoinitiator, and a solvent. The photoinitiator is a material that is added in a small amount to UV resin to cause a polymerization reaction to be initiated upon receiving UV light from an ultraviolet lamp. The solvent can include propylene glycol monomethyl ether acetate (PGMEA).

In FIG. 1, the second electrode 120 can be disposed on the substrate 100 and in a portion (for example, a right portion) of the first area 1A, and a portion (for example, a left portion) of the second area 2A. Accordingly, the second electrode 120 can overlap the portion (the right portion) of the first area 1A and the portion (the left portion) of the second area 2A. It is illustrated in FIG. 1 that a portion in the first area 1A of the second electrode 120 is integral with a portion in the second area 2A thereof. However, the present disclosure is not limited thereto and the portion in the first area 1A of the second electrode 120 can be separate from a portion in the second area 2A thereof. The second electrode 120 can be, for example, a cathode electrode.

A first insulating layer 102 can be disposed on the 1-1 th electrode 110, the second electrode 120, the 1-2 th electrode 112, and the substrate 100. The light-emitting element 210 can be disposed on the first insulating layer 102.

A second insulating layer 104 can be disposed on the first insulating layer 102 and the light-emitting element 210. The 1-1 th connection line 110C can be disposed on the second insulating layer 104. The 1-1 th connection line 110C can have one side connected to the 1-1 th electrode 110 via one side contact-hole, and the other side (another side) connected to one side electrode 220 of the light-emitting element 210 via the other side contact-hole.

The second connection line 120C can be disposed on the second insulating layer 104. The second connection line 120C can have one of both opposing sides connected to the other side electrode 230 of the light-emitting element 210 via a contact-hole, a middle portion connected to the second electrode 120 via a contact-hole, and the other of both opposing sides extending through the second insulating layer 104 so as to be disposed on the first insulating layer 102. Each of the first insulating layer 102 and the second insulating layer 104 can be made of an organic material such as benzocyclobutene or photo acryl. Each of the first insulating layer 102 and the second insulating layer 104 can be made of, for example, a transparent material. Embodiments of the present disclosure are not limited thereto.

The 1-2 th connection line 112C can be disposed on the second insulating layer 104. The 1-2 th connection line 112C can have one side connected to the 1-2 th electrode 112 via a through-hole, and the other side (another side) extending through the second insulating layer 104 so as to be disposed on the first insulating layer 102.

A bank 106 can be disposed on the 1-1 th connection line 110C, the second connection line 120C, the 1-2 th connection line 112C, and the second insulating layer 104. The bank 106 can include a black bank. The bank 106 can include a black material. The bank 106 can be formed by spraying black ink, in one example. The bank can include black matrix. The bank 106 can be positioned to fill the contact-hole of the 1-1 th connection line 110C, the contact-hole of the second connection line 120C, and the contact-hole of the 1-2 th connection line 112C.

A sealing layer 108 can be disposed on the bank 106, a portion of the 1-1 th connection line 110C, a portion of the second connection line 120C, and the second insulating layer 104.

The sealing layer 108 protects the light-emitting element 210 from external impact or foreign matter.

The light-emitting element 210 can include a micro light-emitting diode chip. A structure of the light-emitting element 210 will be described with reference to FIG. 2.

Figure 2:
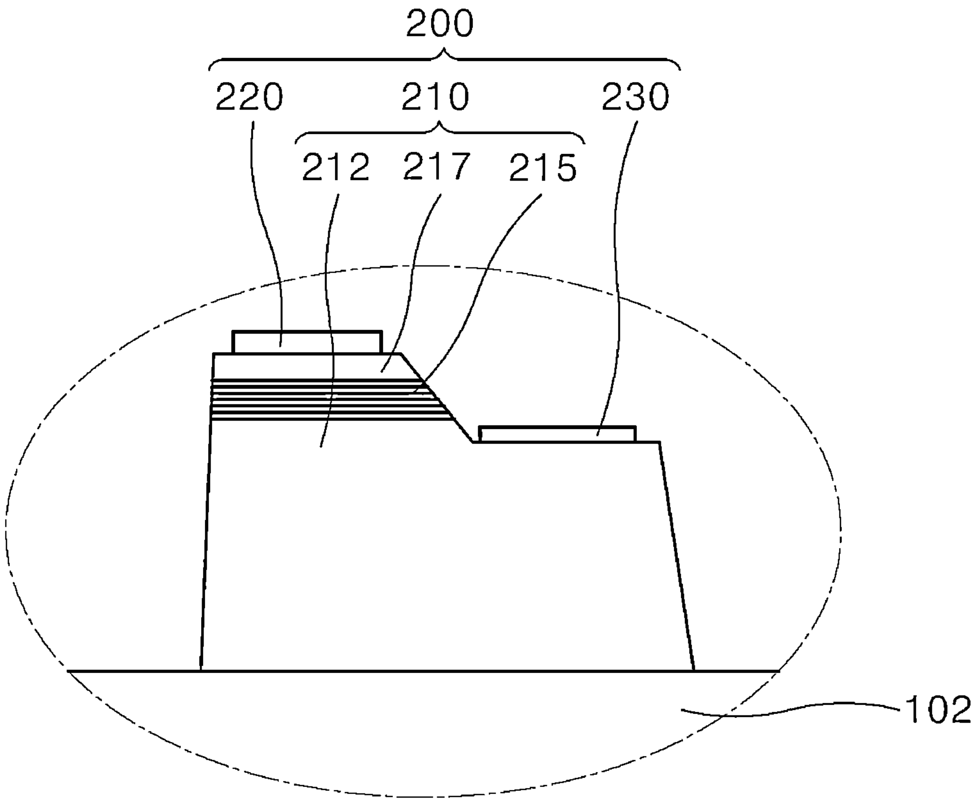
FIG. 2 is a cross-sectional view schematically showing a structure of a light-emitting structure including a light-emitting element according to an embodiment of the present disclosure.

FIG. 2 is a cross-sectional view schematically showing a structure of a light-emitting structure including a light-emitting element according to an embodiment of the present disclosure.

Referring to FIG. 2, a light-emitting structure 200 according to an embodiment of the present disclosure can include the light-emitting element 210, one side electrode 220, and the other side electrode 230.

The light-emitting element 210 can be disposed on the first insulating layer 102.

The light-emitting element 210 can include a first semiconductor layer 212, an active layer 215 disposed on the first semiconductor layer 212, and a second semiconductor layer 217 disposed on the active layer 215.

One side electrode 220 of the light-emitting structure 200 can be disposed on the second semiconductor layer 217. The other side electrode 230 of the light-emitting structure 200 can be disposed on the first semiconductor layer 212.

In an embodiment of the present disclosure, an example in which the light-emitting element 210 is of a lateral type is described for convenience of illustration. However, the present disclosure is not limited thereto. In another example, the light-emitting element can be of a vertical type or a flip chip type.

The first semiconductor layer 212 is a layer for supplying electrons to the active layer 215, and can include a nitride semiconductor containing first conductivity type impurities. For example, the first conductivity-type impurity can include an N-type impurity. The first semiconductor layer 212 according to an embodiment of the present disclosure can be made of a n-GaN-based semiconductor material. The n-GaN-based semiconductor material can include, for example, gallium nitride (GaN), aluminum gallium nitride (AlGaN), indium gallium nitride (InGaN), or aluminum gallium indium nitride (AlInGaN). In this regard, the impurity, for example, Si, Ge, Se, Te, or C can be doped into the first semiconductor layer 212.

The active layer 215 disposed on one side of an upper surface of the first semiconductor layer 212 can include a multi-quantum well (MQW) structure having a well layer and a barrier layer having a higher band gap than that of the well layer. The active layer 215 according to an embodiment of the present disclosure can have a multi-quantum well structure such as InGaN/GaN.

The second semiconductor layer 217 is a layer for injecting holes into the active layer 215. The second semiconductor layer 217 can include a nitride semiconductor containing a second conductivity type impurity. For example, the second conductivity type impurity can include a P-type impurity. The second semiconductor layer 217 according to an embodiment of the present disclosure can be made of a p-GaN-based semiconductor material. In one example, the p-GaN-based semiconductor material can include GaN, AlGaN, InGaN, or AlInGaN. In this regard, the impurity such as Mg, Zn, or Be can be doped into the second semiconductor layer 217.

The light-emitting element 210 can constitute a sub-pixel. The sub-pixel can emit red, blue, or green light in general. However, the present disclosure is not limited thereto. Moreover, the light-emitting element 210 can include a sub-pixel that emits white light.

One side electrode 220 can be a p-type electrode and the other side electrode 230 can be an n-type electrode. Whether one side electrode 220 is a p-type electrode and the other side electrode 230 is an n-type electrode can be determined based on whether the electrode supplies electrons or holes, for example, whether the electrode is electrically connected to the p-type semiconductor layer or to the n-type semiconductor layer. However, in the present disclosure, an example in which one side electrode 220 acts as a p-type electrode and the other side electrode 230 acts as an n-type electrode is described.

Each of one side and the other side electrodes 220 and 230 according to an embodiment of the present disclosure can be made of at least one selected from metal materials such as Au, W, Pt, Si, Ir, Ag, Cu, Ni, Ti, or Cr and an alloy thereof. Each of one side and the other side electrodes 220 and 230 according to another embodiment can be made of a transparent conductive material. The transparent conductive material can include ITO (Indium Tin Oxide) or IZO (Indium Zinc Oxide). However, the present disclosure is not limited thereto.

The first semiconductor layer 212, the active layer 215, and the second semiconductor layer 217 can be sequentially stacked on a semiconductor substrate to constitute the light-emitting element 210. The semiconductor substrate can include a semiconductor material and thus can be embodied as a sapphire substrate or a silicon substrate. This semiconductor substrate can be used as a growth substrate for growing each of the first semiconductor layer 212, the active layer 215, and the second semiconductor layer 217, and then can be removed from the first semiconductor layer 212 using a substrate removal process. In this regard, the substrate removal process can include a laser lift off scheme or a chemical lift off scheme. Accordingly, as the semiconductor substrate for growth is removed from the light-emitting element 210, the light-emitting element 210 can have a relatively smaller thickness. Thus, the light-emitting element 210 can be received in each sub-pixel.

Figure 3:
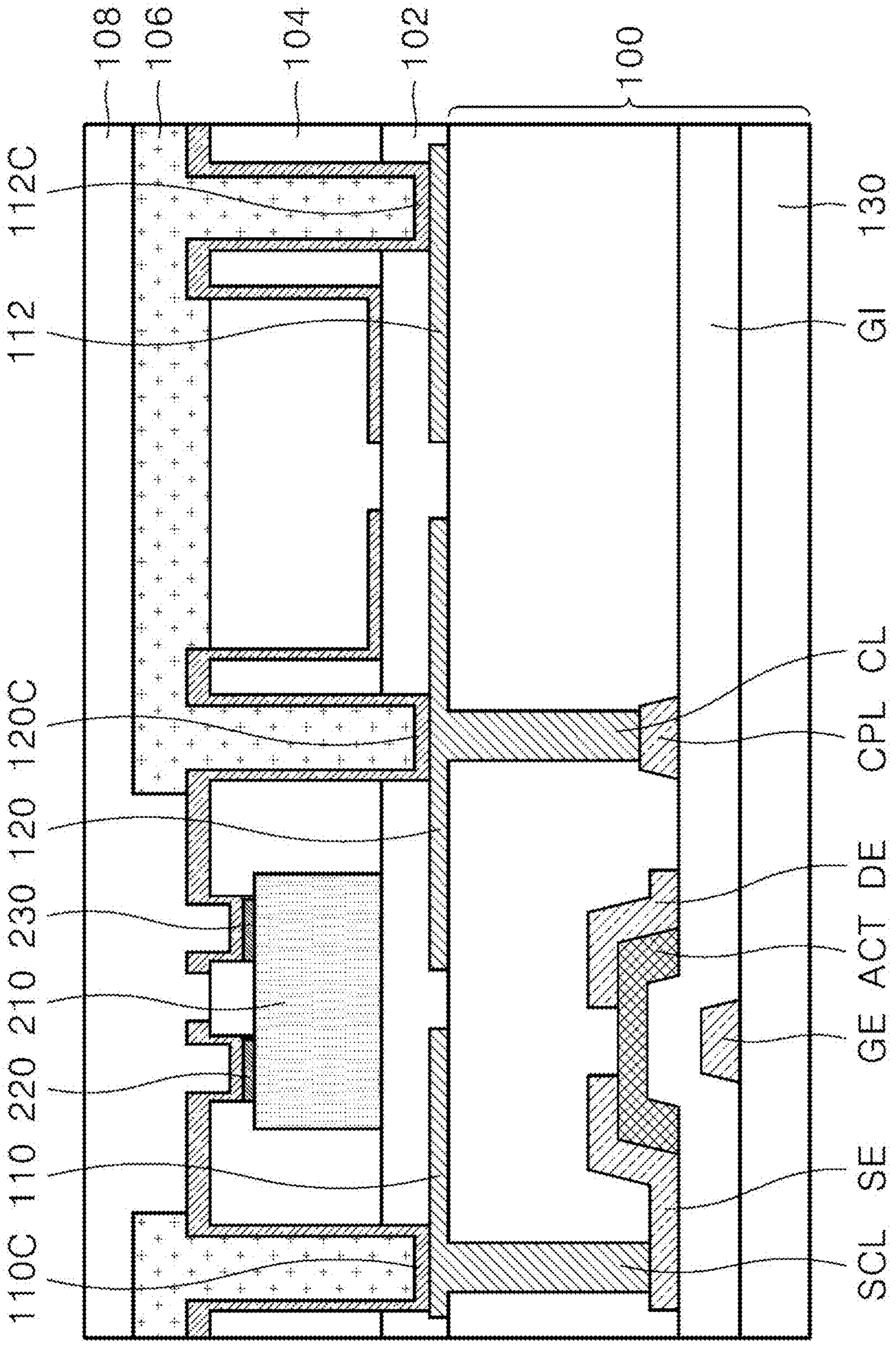
FIG. 3 is a cross-sectional view showing a structure of a substrate including a thin-film transistor according to an embodiment of the present disclosure.

FIG. 3 is a cross-sectional view showing a structure of a substrate including a thin-film transistor TFT according to an embodiment of the present disclosure.

Referring to FIG. 3, the substrate 100 according to an embodiment of the present disclosure can include the thin-film transistor TFT.

The substrate 100 can include a base substrate 130, a gate electrode GE disposed on the base substrate 130, and a gate insulating layer GI disposed on the base substrate 130 and the gate electrode GE. The base substrate 130 refers to a thin-film transistor array substrate, which can be made of glass or plastic. The base substrate 130 can be formed by bonding two or more substrates to each other, or can include two or more separate layers.

The gate electrode GE together with a gate line can be disposed on the base substrate 130. This gate electrode GE is covered with the gate insulating layer GI. The gate insulating layer GI can be composed of a single layer or a plurality of layers made of an inorganic material which can include silicon oxide (SiOx), silicon nitride (SiNx), or the like.

Moreover, the substrate 100 can include an active layer ACT and a common power line CPL disposed on the gate insulating layer GI, and a source electrode SE and a drain electrode DE disposed on the gate insulating layer GI and the active layer ACT.

The active layer ACT is provided in a pattern (or an island) form and is disposed on the gate insulating layer GI so as to overlap with the gate electrode GE. The active layer ACT can be made of a semiconductor material including one of amorphous silicon, polycrystalline silicon, oxide, and an organic material.

The common power line CPL can be disposed on the base substrate 130 and can extend in a parallel manner with each of a plurality of gate lines. The common power line CPL and the plurality of gate lines can be formed in the same process. Each of the plurality of common power lines CPL supplies a common power provided from an external source to the light-emitting element 210.

The source electrode SE is disposed so as to overlap one side of the active layer ACT. The source electrode SE, a data line, and a driving power line can be formed in the same process.

The drain electrode DE is disposed so as to overlap the other side of the active layer ACT and so as to be spaced apart from the source electrode SE. The drain electrode DE and the source electrode SE can be formed in the same process. The drain electrode DE can branch or protrude from the driving power line adjacent thereto.

The substrate 100 can include a planarization layer PLN which can be disposed on the gate insulating layer GI, the source electrode SE, the active layer ACT, the drain electrode DE, and the common power line CPL.

The 1-1 th electrode 110 can be connected to the source electrode SE via a source connection line SCL filling a contact-hole. The second electrode 120 can be connected to the common power line CPL via a connection line CL filling a contact-hole.

Figure 4A:
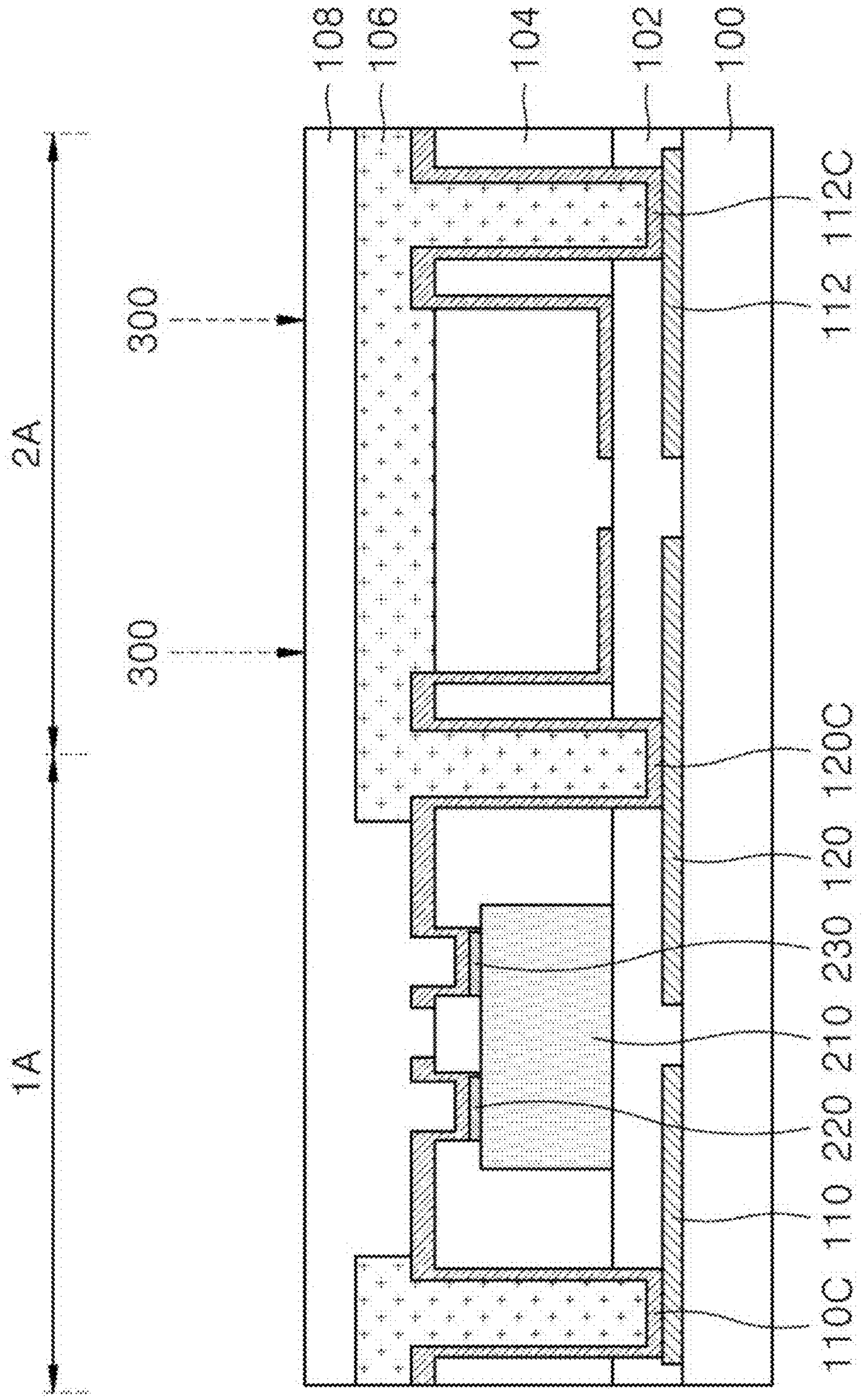
FIGS. 4A, 4B, and 5 are diagrams showing an example in which when a first light-emitting element has a dark spot defect, the first light-emitting element is repaired using a second light-emitting element in a display device according to an embodiment of the present disclosure.
Figure 4B:
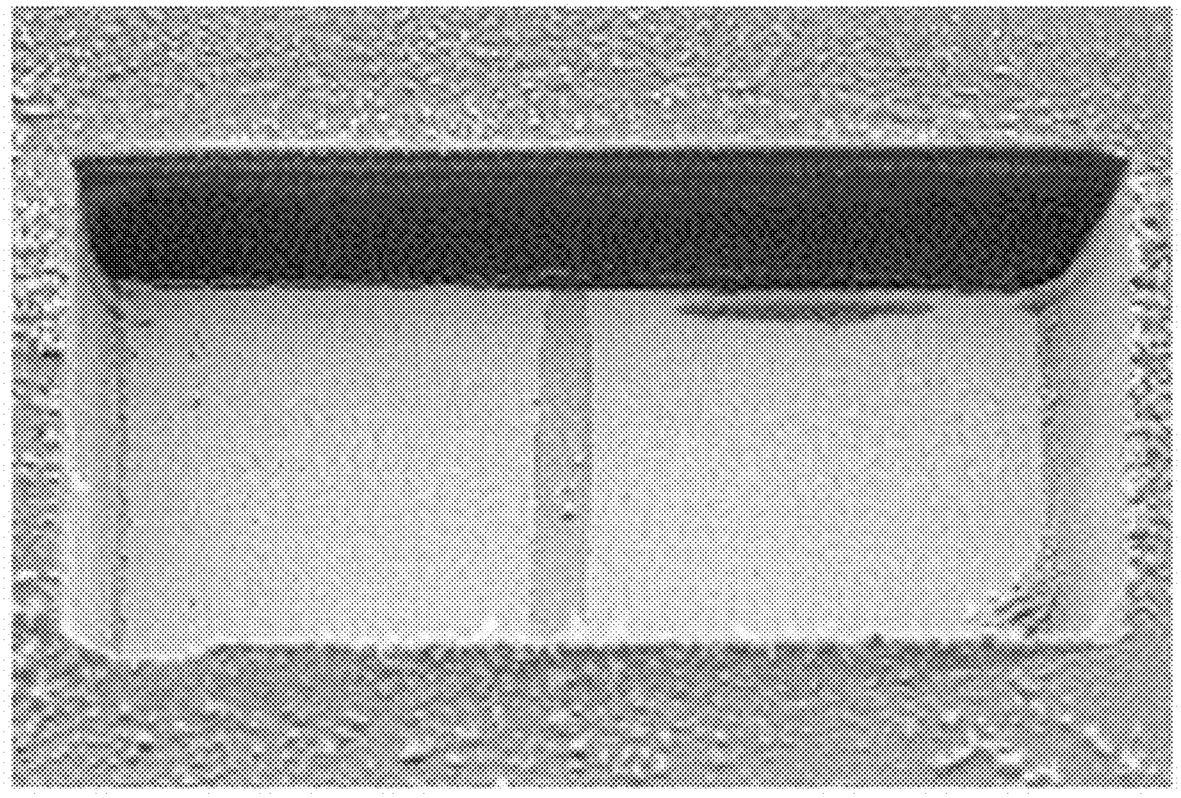
Figure 5:
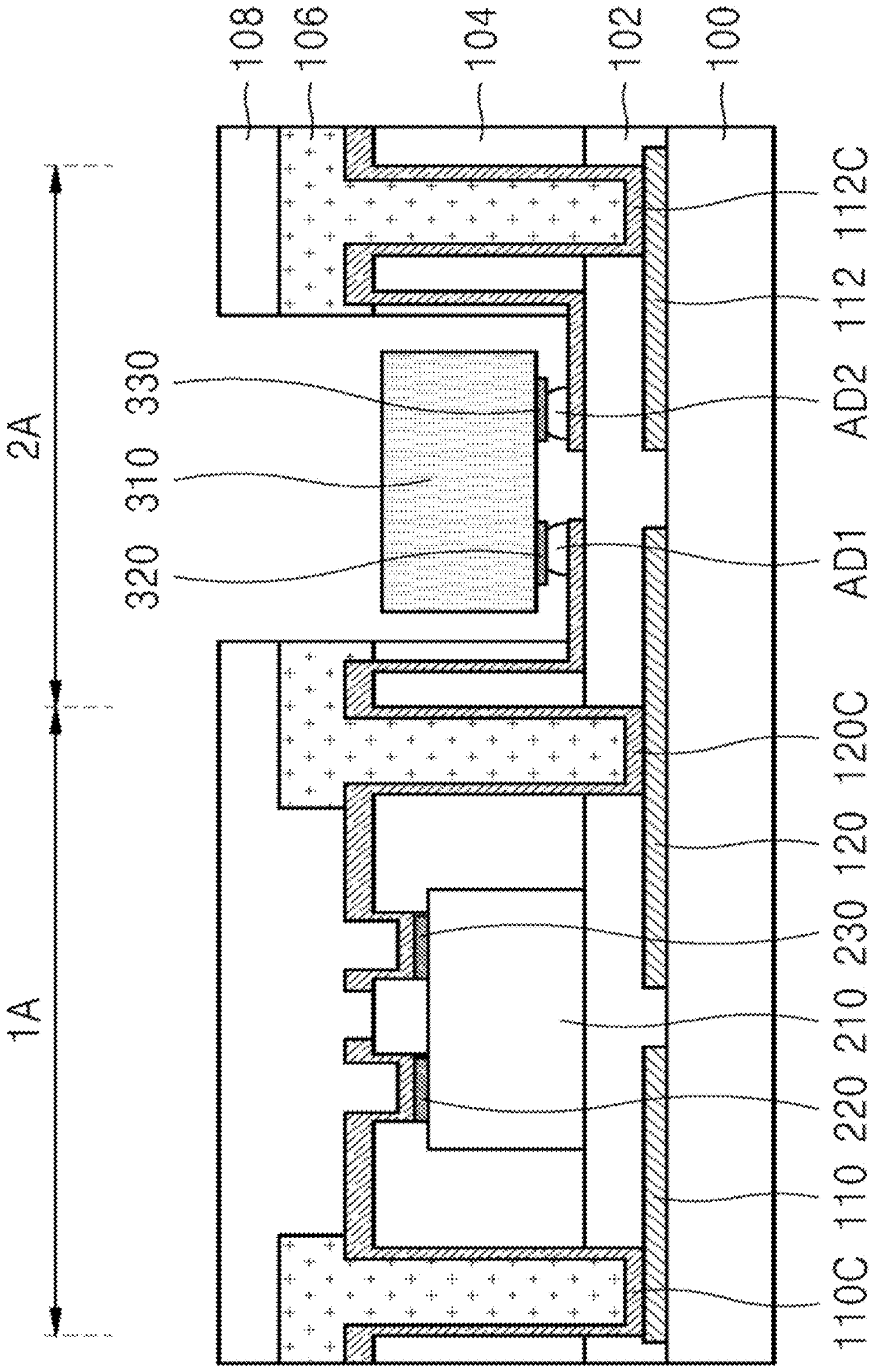

FIGS. 4A, 4B, and 5 are views showing examples in which when a first light-emitting element has a dark spot defect, the first light-emitting element is repaired using a second light-emitting element in a display device according to an embodiment of the present disclosure. Particularly, FIG. 4A shows that when the first light-emitting element 210 in the first area 1A as a display area AA has a dark spot defect, trimming of the second area 2A as the repair area with laser light 300 is performed. FIG. 4B is a plan view of the second area 2A after the laser trimming according to an embodiment of the present disclosure.

Referring to FIG. 4A, a light-emission test is performed on the first light-emitting element 210 according to an embodiment of the present disclosure. When the first light-emitting element 210 has a dark spot defect, the laser light 300 is irradiated to the second area 2A as the repair area.

The laser light 300 is continuously irradiated to the second area 2A as the repair area to remove one of the sealing layer 108 as the organic layer, the bank 106 and the second insulating layer 104 such that the second connection line 120C and the 1-2 th connection line 112C disposed on the first insulating layer 102 are exposed.

Referring to FIG. 5, when the second connection line 120C and the 1-2 th connection line 112C are revealed under the irradiation of the laser light 300, a second light-emitting element 310 of good quality can be disposed in the second area 2A as the repair area so as to be connected to the second connection line 120C and the 1-2 th connection line 112C.

One side electrode 320 of the second light-emitting element 310 can be connected to the second connection line 120C via a first conductive adhesive AD1, while the other side electrode 330 of the second light-emitting element 310 can be connected to the 1-2 th connection line 112C via a second conductive adhesive AD2.

Each of the first and second conductive adhesive AD1 and AD2 can contain a tackifier, a compound, a photo acid generator (PAG), and a quencher. The tackifier can contain a foaming agent, antioxidant, dendrimer, and a photoactive resin. The photoactive resin can include novolac resin as a chemical amplified resist. The compound can contain an alkali developable binder, a silicon (Si)-based binder, a photoinitiator, and a solvent. The photoinitiator is a material that initiates a polymerization reaction upon receiving UV light emitted from an ultraviolet UV lamp during an exposure process. The solvent can include propylene glycol monomethyl ether acetate (PGMEA).

Referring to FIG. 5, the substrate 100 includes the first area 1A and the second area 2A. The first light-emitting element 210 can be disposed on the substrate 100 and in the first area 1A, while the second light-emitting element 310 can be disposed on the substrate 100 and in the second area 2A.

The 1-1 th electrode 110 can be disposed on the substrate 100 and in the first area 1A. The 1-2 th electrode 112 can be disposed on the substrate 100 and in the second area 2A. The second electrode 120 can be disposed on the substrate 100 and in the portion (for example, the right portion) of the first area 1A, and the portion (for example, the left portion) of the second area 2A.

One side electrode 220 of the first light-emitting element 210 is connected to the 1-1 th electrode 110 via the 1-1 th connection line 110C, while the other side electrode 230 of the first light-emitting element 210 is connected to the second electrode 120 via the second connection line 120C.

One side electrode 320 of the second light-emitting element 310 is connected to the second electrode 120 via the second connection line 120C, while the other side electrode 330 of the second light-emitting element 310 is connected to the 1-2 th electrode 112 via the 1-2 th connection line 112C.

Therefore, according to the structure described above, even when the first light-emitting element 210 does not normally operate due to the dark spot defect, the second light-emitting element 310 connected to the 1-2 th electrode 112 and the second electrode 120 can normally operate such that a corresponding pixel can emit light.

Figure 6:
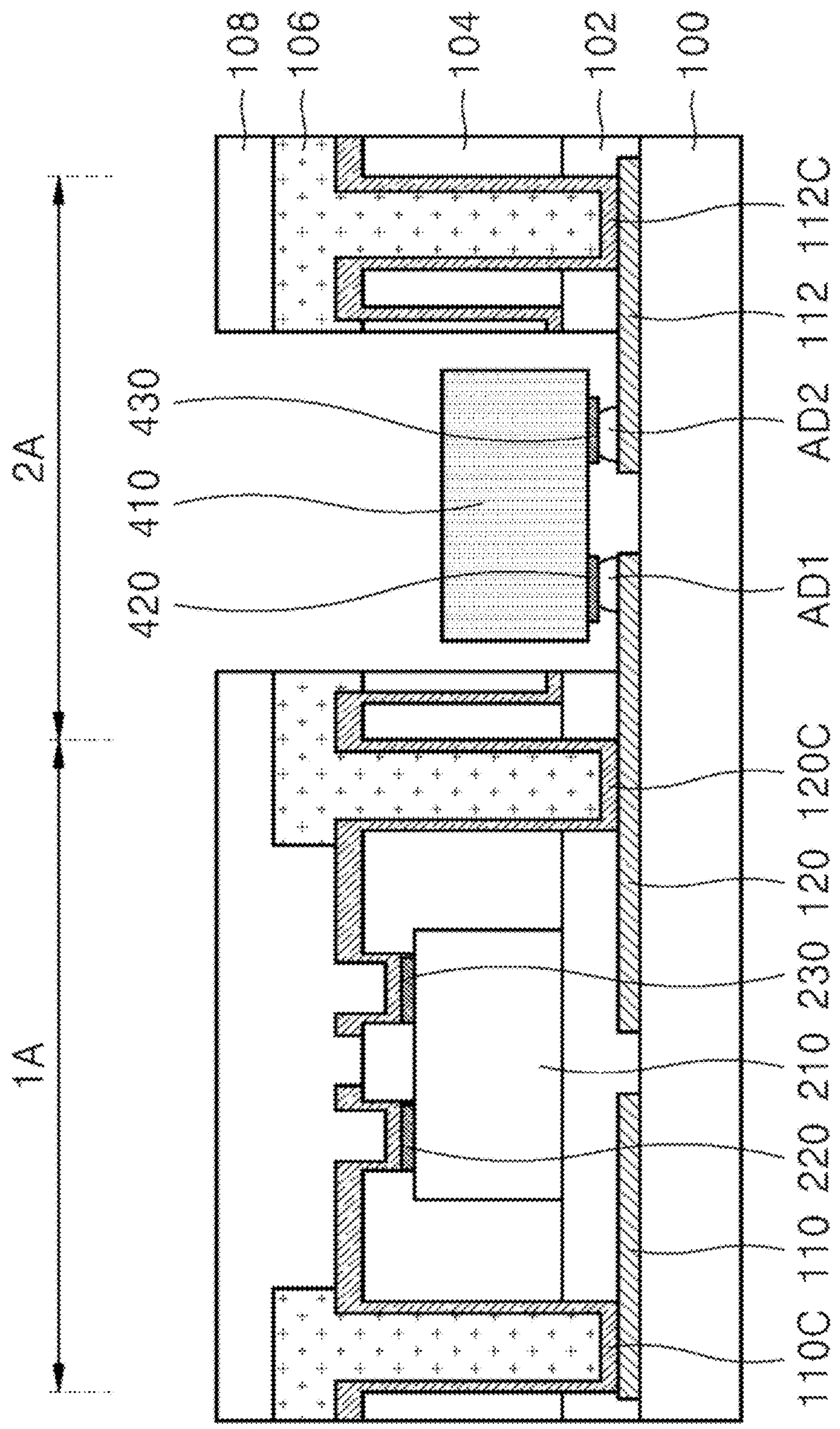
FIG. 6 is a diagram showing an example in which when a first light-emitting element has a dark spot defect, the first light-emitting element is repaired using a second light-emitting element in a display device according to another embodiment of the present disclosure.

FIG. 6 is a diagram showing an example in which when a first light-emitting element has a dark spot defect, the first light-emitting element is repaired using a second light-emitting element in a display device according to another embodiment of the present disclosure.

Referring to FIG. 6, in the display device according to another embodiment of the present disclosure, the substrate 100 includes the first area 1A and the second area 2A, and the first light-emitting element 210 can be disposed on the substrate 100 and in the first area 1A while a second light-emitting element 410 can be disposed on the substrate 100 and in the second area 2A.

The 1-1 th electrode 110 can be disposed on the substrate 100 and in the first area 1A. The 1-2 th electrode 112 can be disposed on the substrate 100 and in the second area 2A. The second electrode 120 can be disposed on the substrate 100 and in the portion (for example, the right portion) of the first area 1A, and the portion (for example, the left portion) of the second area 2A.

One side electrode 220 of the first light-emitting element 210 can be connected to the 1-1 th electrode 110 via the 1-1 th connection line 110C, while the other side electrode 230 of the first light-emitting element 210 can be connected to the second electrode 120 via the second connection line 120C. The 1-2 th connection line 112C is connected to the 1-2 th electrode 112.

One side electrode 420 of the second light-emitting element 410 can be connected to a portion of the second electrode 120 in the second area 2A, while the other side electrode 430 of the second light-emitting element 410 can be connected to the 1-2 th electrode 112 in the second area 2A. For example, one side electrode 420 of the second light-emitting element 410 can be connected to the second electrode 120 as the cathode electrode, while the other side electrode 430 can be connected to the 1-2 th electrode 112 as the anode electrode.

One side electrode 420 of the second light-emitting element 410 can be connected to the second electrode 120 via the first conductive adhesive AD1, while the other side electrode 430 of the second light-emitting element 410 can be connected to the 1-2 th electrode 112 via the second conductive adhesive AD2.

For example, when the first light-emitting element 210 has a dark spot defect, the first light-emitting element 210 does not perform a light-emitting operation.

For example, the second light-emitting element 410 disposed in the second area 2A as the repair area can receive the power via the cathode electrode as the second electrode 120 connected to one side electrode 420 thereof, and the anode electrode as the 1-2 th electrode 112 connected to the other side electrode 430 thereof, and thus can normally perform the light-emitting operation.

Accordingly, in the display device according to the present disclosure, when the first light-emitting element 210 has a dark spot defect, the second light-emitting element 410 disposed in the repair area can perform the light-emitting operation.

Figure 7:
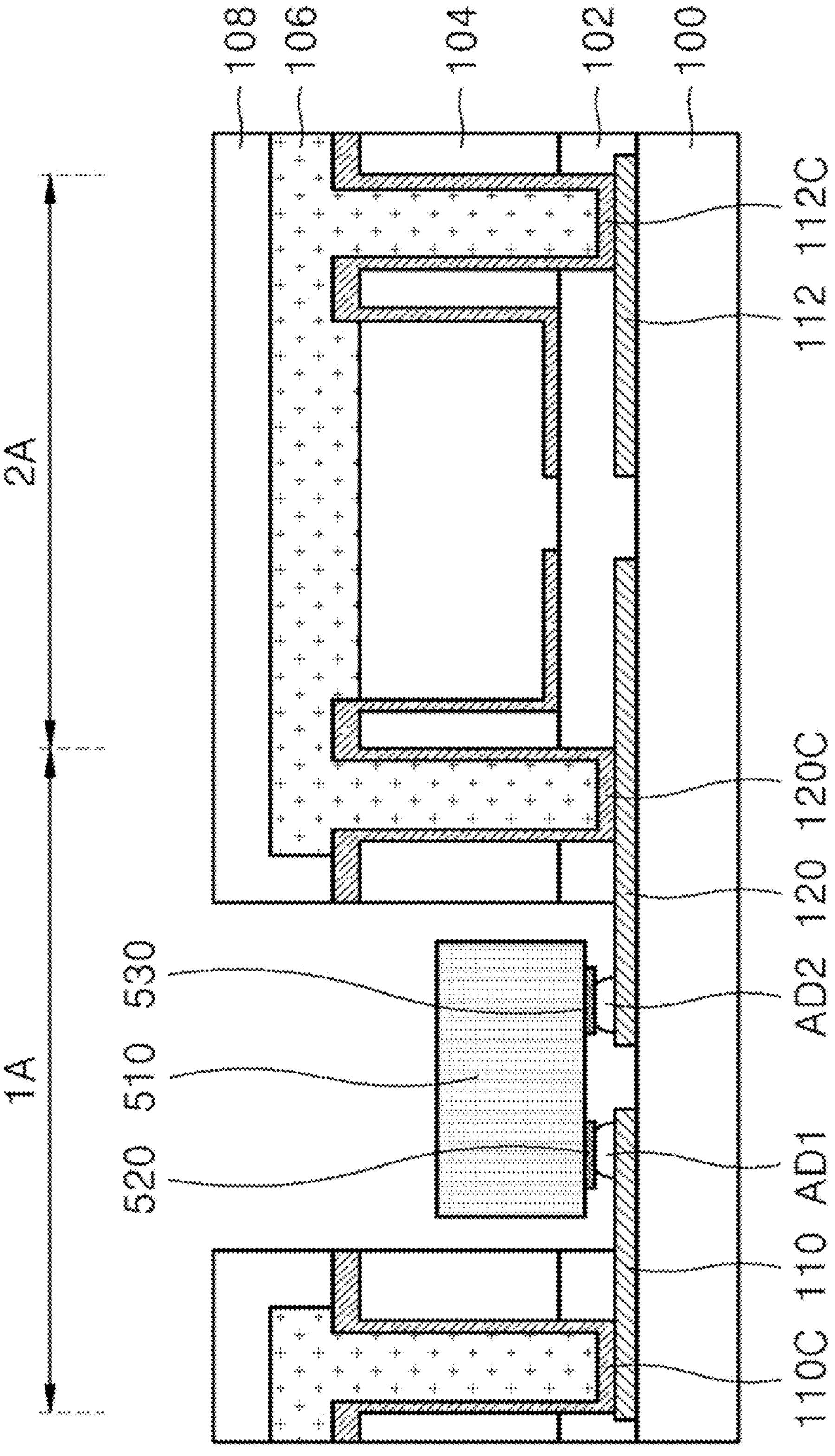
FIG. 7 is a diagram showing an example in which a light-emitting element having a dark spot defect is removed, and a new light-emitting element is disposed in a display device according to still another embodiment of the present disclosure.

FIG. 7 is a diagram showing an example in which a light-emitting element having a dark spot defect is removed, and a new light-emitting element is disposed in a display device according to still another embodiment of the present disclosure.

Referring to FIG. 7, in the display device according to still another embodiment of the present disclosure, when the light-emitting element 210 of the first area 1A of FIG. 1 has a dark spot defect, the light-emitting element 210 can be removed from the first area 1A using laser light, and a new light-emitting element 510 can be disposed in the first area 1A.

In the display device according to still another embodiment of the present disclosure, the substrate 100 includes the first area 1A and the second area 2A, and the new light-emitting element 510 can be disposed on the substrate 100 and in the first area 1A.

The 1-1 th electrode 110 can be disposed on the substrate 100 and in the first area 1A. The 1-2 th electrode 112 can be disposed on the substrate 100 and in the second area 2A. The second electrode 120 can be disposed on the substrate 100 and in the portion (for example, the right portion) of the first area 1A, and the portion (for example, the left portion) of the second area 2A.

For example, the 1-1 th connection line 110C can be connected to the 1-1 th electrode 110. The 1-2 th connection line 112C can be connected to the 1-2 th electrode 112. The second connection line 120C can be connected to the second electrode 120. The 1-1 th electrode 110 or the 1-2 th electrode 112 can be a first electrode.

One side electrode 520 of the light-emitting element 510 can be connected to the 1-1 th electrode 110, while the other side electrode 530 of the light-emitting element 510 can be connected to the second electrode 120.

For example, unlike the light-emitting element 210 that has a dark spot defect, the new light-emitting element 510 can be connected to the 1-1 th electrode 110 and the second electrode 120 in a flip bonding manner.

One side electrode 520 of the light-emitting element 510 can be connected to the 1-1 th electrode 110 via the first conductive adhesive AD1, while the other side electrode 530 of the light-emitting element 510 can be connected to the second electrode 120 via the second conductive adhesive AD2.

Figure 8:
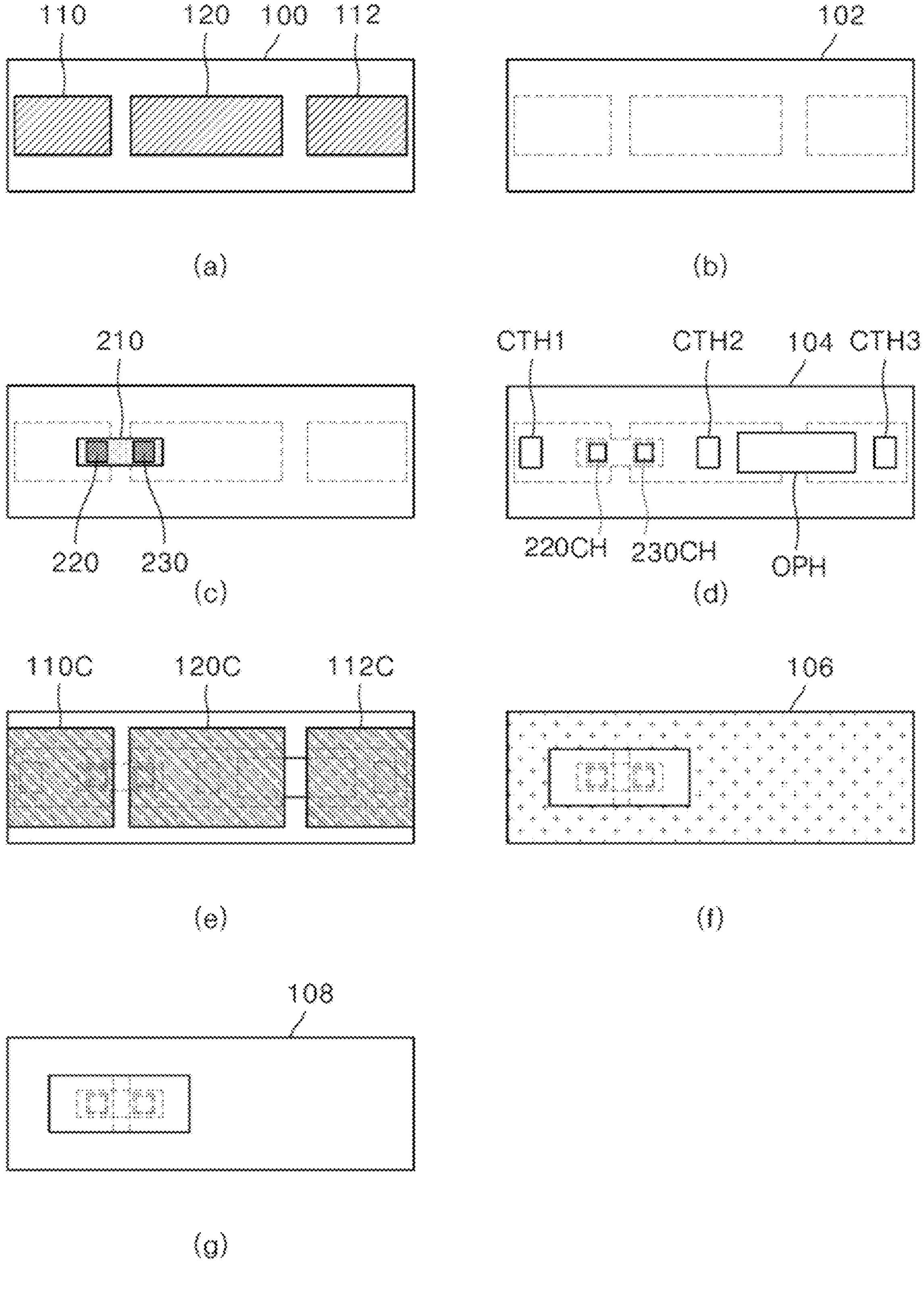
FIG. 8 is a plan view showing a manufacturing process of a display device according to an embodiment of the present disclosure.

FIG. 8 is a plan view showing a manufacturing process of a display device according to an embodiment of the present disclosure.

Referring to FIG. 8, in the process of manufacturing the display device according to an embodiment of the present disclosure, in a plan view, first, as shown in (a) of FIG. 8, the 1-1 th electrode 110, the second electrode 120 and the 1-2 th electrode 112 can be arranged on the substrate 100 so as to be spaced from each other by a certain spacing.

Then, as shown in (b) of FIG. 8, the first insulating layer 102 covering the substrate 100, the 1-1 th electrode 110, the second electrode 120, and the 1-2 th electrode 112 can be disposed.

Subsequently, as shown in (c) of FIG. 8, the light-emitting element 210 having one side electrode 220 and the other side electrode 230 can be disposed on the first insulating layer 102.

Then, as shown in (d) of FIG. 8, the second insulating layer 104 can be disposed on the light-emitting element 210 having one side electrode 220 and the other side electrode 230. Each of a 1-1 th contact-hole CTH1, one side contact-hole 220CH, the other side contact-hole 230CH, a second contact-hole CTH2, an opening hole OPH and a 1-2 th contact-hole CTH3 can be formed in the second insulating layer 104.

The 1-1 th contact-hole CTH1 extends from an upper surface of the second insulating layer 104 downwardly so as to contact the 1-1 th electrode 110 on the substrate 100 and having a predetermined width.

The one side contact-hole 220CTH extends from the upper surface of the second insulating layer 104 downwardly so as to contact one side electrode 220 of the light-emitting element 210 and having a predetermined width.

The other side contact-hole 230CTH extends from the upper surface of the second insulating layer 104 downwardly so as to contact the other side electrode 230 of the light-emitting element 210 and having a predetermined width.

The second contact-hole CTH2 extends from the upper surface of the second insulating layer 104 downwardly so as to contact the second electrode 120 on the substrate 100 and having a predetermined width.

The opening hole OPH extends from the upper surface of the second insulating layer 104 downwardly so as to contact an upper surface of the first insulating layer 102 and having a predetermined width.

The 1-2 th contact-hole CTH3 extends from the upper surface of the second insulating layer 104 downwardly so as to contact the 1-2 th electrode 112 on the substrate 100 and having a predetermined width.

Subsequently, as shown in (e) of FIG. 8, the 1-1 th connection line 110C, the second connection line 120C, and the 1-2 th connection line 112C can be disposed on the 1-1 th contact-hole CTH1, one side contact-hole 220CH, the other side contact-hole 230CH, the second contact-hole CTH2, the opening hole OPH, and the 1-2 th contact-hole CTH3.

Each of the 1-1 th connection line 110C, the second connection line 120C, and the 1-2 th connection line 112C can have a plate shape having a predefined area size.

The 1-1 th connection line 110C can be formed on the second insulating layer 104, and can extend from the upper surface of the second insulating layer 104 along the 1-1 th contact-hole CTH1 downwardly so as to contact the 1-1 th electrode 110 on the substrate 100. Moreover, the 1-1 th connection line 110C can extend from the upper surface of the second insulating layer 104 along one side contact-hole 220CTH downwardly so as to contact one side electrode 220 of the light-emitting element 210.

The second connection line 120C can be formed on the second insulating layer 104, and can extend from the upper surface of the second insulating layer 104 along the other side contact-hole 230CTH downwardly so as to contact the other side electrode 230 of the light-emitting element 210. Moreover, the second connection line 120C can extend from the upper surface of the second insulating layer 104 along the second contact-hole CTH2 downwardly so as to contact the second electrode 120 on the substrate 100. Moreover, the second connection line 120C can extend from the upper surface of the second insulating layer 104 along the opening hole OPH downwardly so as to contact the upper surface of the first insulating layer 102. A portion of the second connection line 120C can be formed on the first insulating layer 102 so as to have a predetermined length.

The 1-2 th connection line 112C can be formed on the second insulating layer 104 and can extend from the upper surface of the second insulating layer 104 along the opening hole OPH downwardly so as to contact the upper surface of the first insulating layer 102. A portion of the 1-2 th connection line 112C can be formed on the first insulating layer 102 so as to have a predetermined length. Moreover, the 1-2 th connection line 112C can extend from the upper surface of the second insulating layer 104 along the 1-2 th contact-hole CTH3 downwardly so as to contact the 1-2 th electrode 112 on the substrate 100.

Subsequently, as shown in (f) of FIG. 8, the bank 106 can be disposed on the second insulating layer 104 so as to cover a remaining area except for the 1-1 th connection line 110C and the second connection line 120C disposed in the first area 1A.

Subsequently, as shown in (g) of FIG. 8, the sealing layer 108 can be disposed on the bank 106 except for the 1-1 th connection line 110C and the second connection line 120C in the first area 1A.

Figure 9:
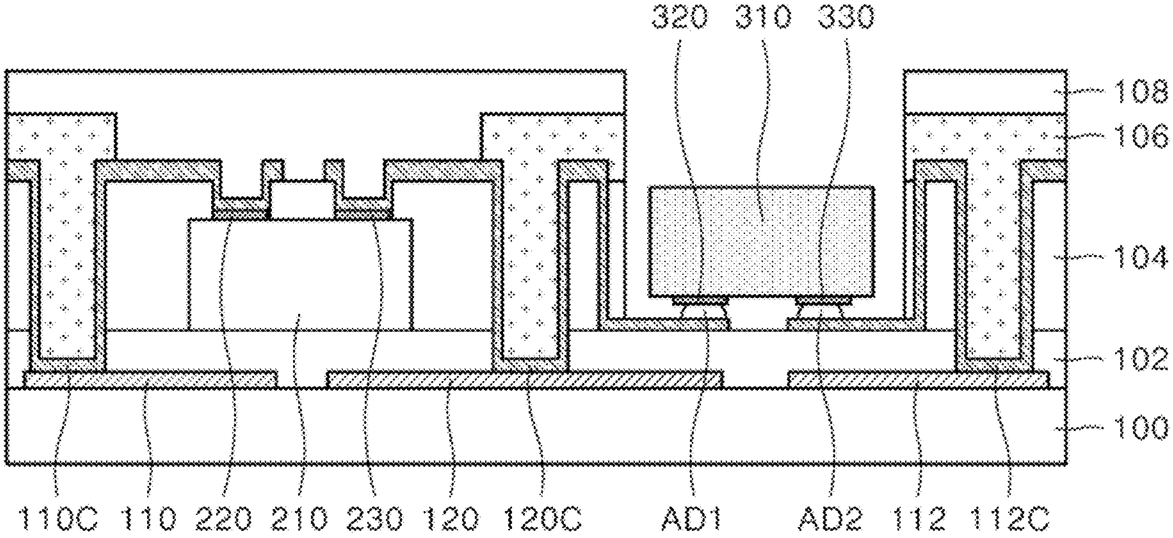
FIG. 9 is a diagram showing an example in which a second light-emitting element is disposed in a second area in place of a first light-emitting element having a dark spot defect in a display device according to an embodiment of the present disclosure.
Figure 9:
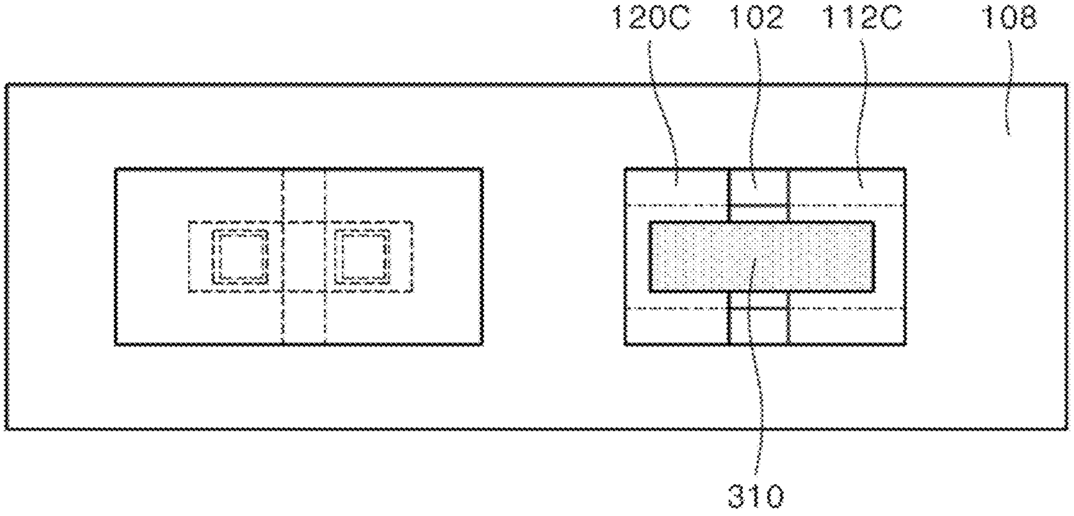

FIG. 9 is a diagram showing an example in which a second light-emitting element is disposed in a second area in place of a first light-emitting element having a dark spot defect in a display device according to an embodiment of the present disclosure.

Referring to (a) of FIG. 9, in the display device according to an embodiment of the present disclosure, the substrate 100 includes the first area 1A and the second area 2A, and the first light-emitting element 210 can be disposed on the substrate 100 and in the first area 1A, while the second light-emitting element 310 can be disposed on the substrate 100 and in the second area 2A.

The 1-1 th electrode 110 can be disposed on the substrate 100 and in the first area 1A. The 1-2 th electrode 112 can be disposed on the substrate and in the second area 2A. The second electrode 120 can be disposed on the substrate 100 and in a portion (for example, a right portion) of the first area 1A, and a portion (for example, a left portion) of the second area 2A.

One side electrode 220 of the first light-emitting element 210 can be connected to the 1-1 th electrode 110 via the 1-1 th connection line 110C. The other side electrode 230 of the first light-emitting element 210 can be connected to the second electrode 120 via the second connection line 120C.

One side electrode 320 of the second light-emitting element 310 can be connected to the second electrode 120 via the second connection line 120C. The other side electrode 330 of the second light-emitting element 310 can be connected to the 1-2 th electrode 112 via the 1-2 th connection line 112C. In this regard, one side electrode 320 of the second light-emitting element 310 can be connected to the second connection line 120C via the first conductive adhesive AD1. The other side electrode 330 of the second light-emitting element 310 can be connected to the 1-2 th connection line 112C via the second conductive adhesive AD2.

Referring to (b) of FIG. 9, the display device according to an embodiment of the present disclosure, in a top view, the second light-emitting element 310 is visible through the opening hole in the second area 2A. The second light-emitting element 310 overlaps with the second connection line 120C and the 1-2 th connection line 112C. Accordingly, the second light-emitting element 310 is connected to the second connection line 120C and the 1-2 th connection line 112C.

In the second area 2A, the first insulating layer 102 can be visible at a bottom of the opening hole, and the sealing layer 108 as the top layer can be visible around the opening hole.

In the first area 1A, the first light-emitting element which has a dark spot defect is visible in the opening hole.

Therefore, in the display device according to an embodiment of the present disclosure, even when the first light-emitting element 210 disposed in the first area 1A does not operate due to a dark spot defect, the second light-emitting element 310 disposed in the second area 2A can normally operate such that the light-emitting operation of the corresponding pixel can be executed.

Figure 10:
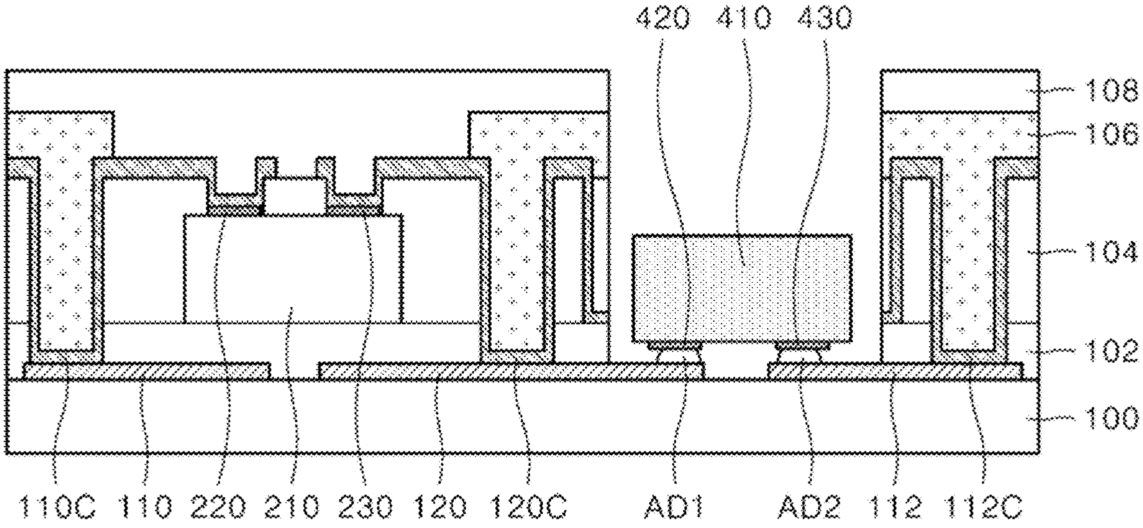
FIG. 10 is a diagram showing an example in which a second light-emitting element is disposed in a second area in place of a first light-emitting element having a dark spot defect in a display device according to another embodiment of the present disclosure.
Figure 10:
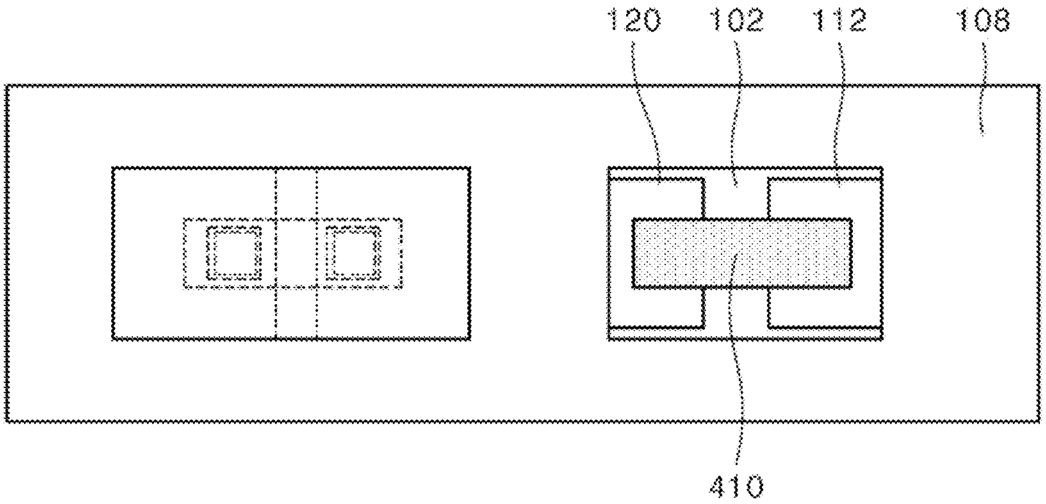

FIG. 10 is a diagram showing an example in which a second light-emitting element is disposed in a second area in place of a first light-emitting element having a dark spot defect in a display device according to another embodiment of the present disclosure.

Referring to (a) of FIG. 10, in the display device according to another embodiment of the present disclosure, the substrate 100 includes the first area 1A and the second area 2A. The first light-emitting element 210 can be disposed on the substrate 100 and in the first area 1A while the second light-emitting element 410 can be disposed on the substrate 100 and in the second area 2A.

The 1-1 th electrode 110 can be disposed on the substrate 100 and in the first area 1A. The 1-2 th electrode 112 can be disposed on the substrate 100 and in the second area 2A. The second electrode 120 can be disposed on the substrate 100 and in the portion (for example, the right portion) of the first area 1A, and the portion (for example, the left portion) of the second area 2A.

One side electrode 220 of the first light-emitting element 210 can be connected to the 1-1 th electrode 110 via the 1-1 th connection line 110C, while the other side electrode 230 of the first light-emitting element 210 can be connected to the second electrode 120 via the second connection line 120C. In this regard, the 1-2 th connection line 112C is connected to the 1-2 th electrode 112.

One side electrode 420 of the second light-emitting element 410 can be connected to a portion of the second electrode 120 in the second area 2A, while the other side electrode 430 of the second light-emitting element 410 can be connected to the 1-2 th electrode 112 in the second area 2A. For example, one side electrode 420 of the second light-emitting element 410 can be connected to the second electrode 120 as the cathode electrode, while the other side electrode 430 can be connected to the 1-2 th electrode 112 as the anode electrode. In this regard, one side electrode 420 of the second light-emitting element 410 can be connected to the second electrode 120 via the first conductive adhesive AD1, while the other side electrode 430 of the second light-emitting element 410 can be connected to the 1-2 th electrode 112 via the second conductive adhesive AD2.

Referring to (b) of FIG. 10, the display device according to another embodiment of the present disclosure, in a top view, in the second area 2A, the second light-emitting element 410 is visible through the opening hole, and the second light-emitting element 410 overlaps with the second electrode 120 and the 1-2 th electrode 112. Accordingly, the second light-emitting element 410 is connected to the second electrode 120 and the 1-2 th electrode 112.

In the second area 2A, the first insulating layer 102 can be visible at the bottom of the opening hole, and the sealing layer 108 as the top layer can be visible around the opening hole.

In the first area 1A, the first light-emitting element which has a dark spot defect is visible in the opening hole.

When the first light-emitting element has a dark spot defect, the first light-emitting element does not execution a light-emitting operation.

Thus, the second light-emitting element 410 disposed in the second area 2A as the repair area receives the power via the cathode electrode as the second electrode 120 connected to the one side electrode 420, and via the anode electrode as the 1-2 th electrode 112 connected to the other side electrode 430, and thus can perform the light-emitting operation.

Therefore, in the display device according to another embodiment of the present disclosure, even when the first light-emitting element 210 disposed in the first area 1A does not operate due to a dark spot defect, the second light-emitting element 410 disposed in the second area 2A can normally operate such that the light-emitting operation of the corresponding pixel can be executed.

Figure 11:
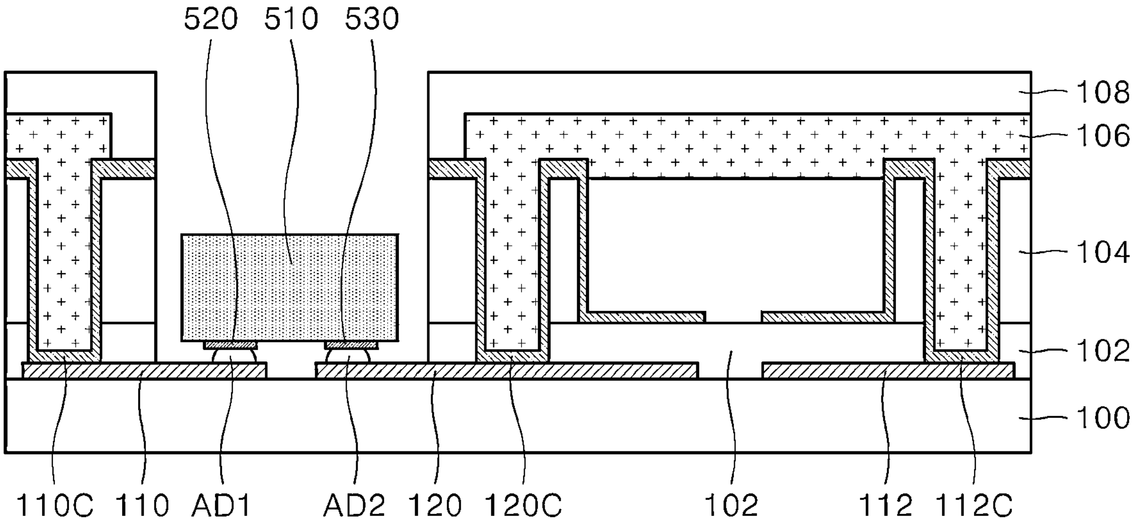
FIG. 11 is a diagram showing an example in which a second light-emitting element is disposed in a first area in place of a first light-emitting element having a dark spot defect in a display device according to still another embodiment of the present disclosure.
Figure 11:
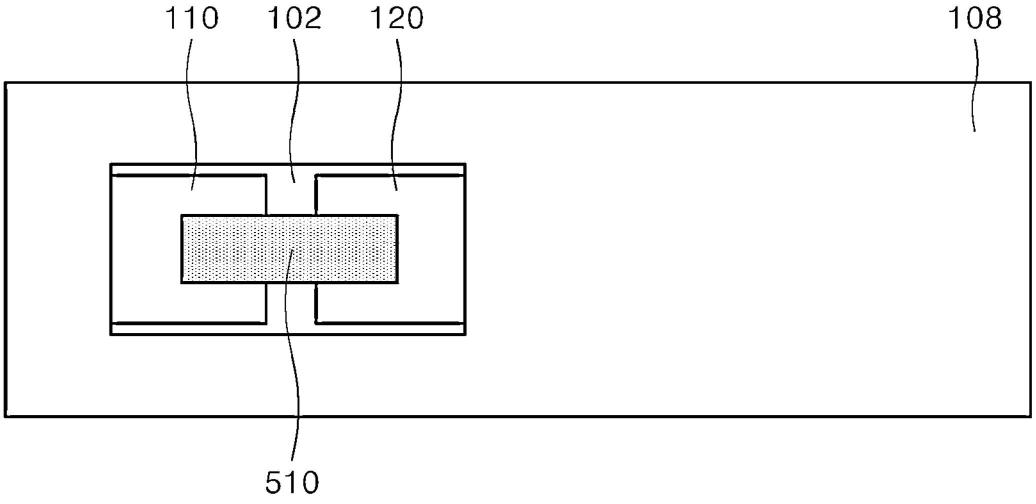

FIG. 11 is a diagram showing an example in which a second light-emitting element is disposed in a first area in place of a first light-emitting element having a dark spot defect in a display device according to still another embodiment of the present disclosure.

Referring to (a) of FIG. 11, the display device according to still another embodiment of the present disclosure, when the first light-emitting element 210 in the first area 1A as shown in FIG. 1 has a dark spot defect, the first light-emitting element 210 can be removed using laser light, and the new second light-emitting element 510 can be disposed in the first area 1A.

In the display device according to still another embodiment of the present disclosure, the substrate 100 includes the first area 1A and the second area 2A, and the new light-emitting element 510 can be disposed on the substrate 100 and in the first area 1A.

In the regard, the light-emitting element 510 can be disposed on the substrate 100 and in the first area 1A in the flip-bonding manner.

The 1-1 th electrode 110 can be disposed on the substrate 100 and in the first area 1A. The 1-2 th electrode 112 can be disposed on the substrate 100 and in the second area 2A. The second electrode 120 can be disposed on the substrate 100 and in the portion (for example, the right portion) of the first area 1A, and the portion (for example, the left portion) of the second area 2A.

In this regard, the 1-1 th connection line 110C can be connected to the 1-1 th electrode 110. The 1-2 th connection line 112C can be connected to the 1-2 th electrode 112. The second connection line 120C can be connected to the second electrode 120.

One side electrode 520 of the light-emitting element 510 can be connected to the 1-1 th electrode 110, while the other side electrode 530 of the light-emitting element 510 can be connected to the second electrode 120.

In this regard, unlike the light-emitting element 210 that has a dark spot defect, the new light-emitting element 510 can be connected to the 1-1 th electrode 110 and the second electrode 120 in a flip bonding manner. For example, one side electrode 520 of the light-emitting element 510 can be connected to the 1-1 th electrode 110 via the first conductive adhesive AD1, while the other side electrode 530 of the light-emitting element 510 can be connected to the second electrode 120 via the second conductive adhesive AD2.

Referring to (b) of FIG. 11, the display device according to still another embodiment of the present disclosure, in a top view, in the first area 1A, the second light-emitting element 510 is visible through the opening hole, and the second light-emitting element 510 overlaps with the 1-1 th electrode 110 and the second electrode 120. Accordingly, it can be identified that the second light-emitting element 510 is connected to the 1-1 th electrode 110 and the second electrode 120.

In the first area 1A, the first insulating layer 102 can be visible at the bottom of the opening hole, and the sealing layer 108 as the top layer can be visible around the opening hole. An entirety of the second area 2A is covered with the sealing layer 108.

In one example, in the display device according to the present disclosure, the light-emitting operation of each of the light-emitting element 210 and the second light-emitting elements 310, 410, and 510 can be performed by a driver.

Each of the light-emitting elements 210, 310, 410, and 510 can be one of a first Sub-Pixel® to a fourth sub-pixel (W).

The driver can control the light-emission operation of one or more sub-pixels (R, G, B, and W) among the first Sub-Pix® (R) to the fourth sub-pixel (W).

In this regard, when the sub-pixel includes a micro light-emitting element, the driver can be, for example, a 'micro driver' controlling emission of at least one or more light-emitting elements.

One driver can be disposed in each light-emitting area composed of, for example, several hundred of the at least one or more sub-pixels (R, G, B, W).

Each of the first sub-pixel (R) to the fourth sub-pixel W can include an organic light-emitting diode (OLED).

The driver can be controlled so that a data voltage set in a first control mode is applied to at least one sub-pixel for a pulse width set in a second control mode. The first control mode represents a high luminance operation mode of at least one sub-pixel, and is a mode in which a pulse width is fixed to a specific value and a current value and a data voltage value for at least one sub-pixel are variable.

In the first control mode, the driver can be controlled such that the pulse width is fixed to the specific value, the current value of at least one sub-pixel is a specific value in a range of 30 to 60 milliamps (mA), and the data voltage value is a specific value in a range of 1 to 2 volts.

The second control mode represents a low luminance operation mode of at least one sub-pixel. In the second control mode, each of the current value and the data voltage value for at least one sub-pixel is fixed to a specific value, and the pulse width is variable. In the second control mode, the driver can be controlled such that each of the data voltage value and the current value for at least one sub-pixel is fixed to a specific value, and the pulse width is a specific value in a range of 10 to 1,000 micro seconds (μs).

The light-emitting element can be embodied as a 10 to 100 μm sized LED. The light-emitting element can be formed by growing a plurality of thin-films made of an inorganic material such as Al, Ga, N, P, As, etc. on a sapphire substrate or a silicon substrate, and cutting the sapphire substrate or the silicon substrate and removing the sapphire substrate or the silicon substrate from the thin-films. In this way, the light-emitting element can be formed in a micro size, and can be transferred to a flexible substrate made of plastic, making it possible to manufacture a flexible display device. Further, the light-emitting element can be formed by growing the thin-film made of the inorganic material, unlike the organic light-emissive layer. Thus, the manufacturing process thereof is simplified and a yield is improved. Moreover, the individually separated light-emitting elements are simply transferred onto the large-area substrate, such that a large-area display device can be manufactured. Moreover, the light-emitting element made of the inorganic material has advantages of high luminance, a long lifespan, and a low cost compared to the LED made of the organic light-emitting material.

The driver can generate a coordinate value of each sub-pixel to emit light among the first sub-pixel (R) to the fourth sub-pixel (W) upon receiving an image signal. The driver can apply the data voltage set in the first control mode to each sub-pixel to emit light corresponding to the generated coordinate value for a pulse width set in the second control mode.

A first aspect of the present disclosure provides a display device comprising: a light-emitting element 210 disposed in a first area 1A; and a repair pad disposed in a second area 2A extending from the first area 1A, wherein the light-emitting element 210 includes: one side electrode 220 connected to a 1-1 th electrode 110 via a 1-1 th connection line 110C; and the other side electrode 230 connected to a second electrode 120 via a second connection line 120C, wherein the repair pad includes a 1-2 th electrode 112, the second electrode 120, the second connection line 120C, and a 1-2 th connection line 112C, wherein the 1-2 th electrode 112 and the second electrode 120 of the repair pad are disposed in the same layer in a corresponding manner to each other, wherein the second connection line 120C and the 1-2 th connection line 112C of the repair pad are disposed in the same layer in a corresponding manner to each other, wherein the second connection line 120C is connected to the second electrode 120, and the 1-2 th connection line 112C connected to the 1-2 th electrode 112, wherein the layer in which the second connection line 120C and the 1-2 th connection line 112C are disposed is different from the layer in which the 1-2 th electrode 112 and the second electrode 120 are disposed.

A second aspect of the present disclosure provides a display device comprising: a substrate 100 including a first area 1A and a second area 2A; a first light-emitting element 210 disposed in the first area 1A; a second light-emitting element 310 disposed in the second area 2A; a 1-1 th electrode 110 disposed on the substrate 100 and in the first area 1A; a second electrode 120 disposed on the substrate 100 and in a portion of the first area 1A and a portion of the second area 2A; a 1-2 th electrode 112 disposed on the substrate 100 and in the second area 2A; a 1-1 th connection line 110C connecting one side electrode 220 of the first light-emitting element 210 and the 1-1 th electrode 110 to each other; a second connection line 120C connecting the second electrode 120 to the other side electrode 230 of the first light-emitting element 210, and connecting the second electrode 120 to one side electrode 320 of the second light-emitting element 310; and a 1-2 th connection line 112C connecting the 1-2 th electrode 112 and the other side electrode 330 of the second light-emitting element 310.

A third aspect of the present disclosure provides a display device comprising: a substrate 100 including a first area 1A and a second area 2A; a first light-emitting element 210 disposed in the first area 1A; a second light-emitting element 310 disposed in the second area 2A; a 1-1 th electrode 110 disposed on the substrate 100 and in the first area 1A; a second electrode 120 disposed on the substrate 100 and in a portion of the first area 1A and a portion of the second area 2A; a 1-2 th electrode 112 disposed on the substrate 100 and in the second area 2A; a 1-1 th connection line 110C connecting one side electrode 220 of the first light-emitting element 210 and the 1-1 th electrode 110 to each other; a second connection line 120C connecting the other side electrode 230 of the first light-emitting element 210 and the second electrode 120 to each other; and a 1-2 th connection line 112C connected to the 1-2 th electrode 112, wherein one side electrode 320 of the second light-emitting element 310 is connected to the second electrode 120 in the second area 2A; wherein the other side electrode 330 of the second light-emitting element 310 is connected to the 1-2 th electrode 112 in the second area 2A.

A fourth aspect of the present disclosure provides a display device comprising: a substrate 100 including a first area 1A and a second area 2A; a light-emitting element 510 disposed in the first area 1A; a 1-1 th electrode 110 disposed on the substrate 100 and in the first area 1A; a second electrode 120 disposed on the substrate 100 and in a portion of the first area 1A and a portion of the second area 2A; a 1-2 th electrode 112 disposed on the substrate 100 and in the second area 2A; a 1-1 th connection line 110C connected to the 1-1 th electrode 110; a second connection line 120C connected to the second electrode 120; and a 1-2 th connection line 112C connected to the 1-2 th electrode 112, wherein one side electrode 520 of the light-emitting element is connected to the 1-1 th electrode, while the other side electrode 530 of the light-emitting element is connected to the second electrode 120.

As described above, according to the embodiments of the present disclosure, the display device in which when a dark spot defect occurs in a light-emitting element, the defective element can be repaired using the new light-emitting element can be realized.

Further, according to the embodiments of the present disclosure, the display device can be realized in which the repair pad is disposed in an extra space in a pixel and is sealed with the bank, and then when the pixel is determined to have a dark spot in light-emission inspection, the bank is removed with laser, and a normal light-emitting element is flip-bonded to the repair pad, thereby repairing the dark spot defective pixel.

Although the embodiments of the present disclosure have been described in more detail with reference to the accompanying drawings, the present disclosure is not necessarily limited to these embodiments, and can be modified in a various manner in the scope of the technical spirit of the present disclosure. Accordingly, the embodiments as disclosed in the present disclosure are intended to describe rather than limit the technical idea of the present disclosure, and the scope of the technical idea of the present disclosure is not limited by these embodiments. Therefore, it should be understood that the embodiments described above are not restrictive but illustrative in all respects. The scope of protection of the present disclosure should be interpreted according to the scope of claims, and all technical ideas in an equivalent scope thereto should be interpreted as being included in the scope of rights of the present disclosure.

What is claimed is:

1. A display device comprising:

a light-emitting element disposed in a first area; and a repair pad disposed in a second area extending from the first area, wherein the light-emitting element includes:

one side electrode connected to a 1-1 th electrode via a 1-1 th connection line; and another side electrode connected to a second electrode via a second connection line, wherein the repair pad includes a 1-2 th electrode, the second electrode, the second connection line, and a 1-2 th connection line, wherein the 1-2 th electrode and the second electrode of the repair pad are disposed in a same layer in a corresponding manner, wherein the second connection line and the 1-2 th connection line of the repair pad are disposed in a same layer in a corresponding manner, wherein the second connection line is connected to the second electrode, and the 1-2 th connection line is connected to the 1-2 th electrode, wherein a bank is disposed on the 1-1 th connection line, the second connection line, and the 1-2 th connection line, wherein a sealing layer is disposed on the bank, a portion of the 1-1 th connection line, and a portion of the second connection line, wherein an opening hole in the second area penetrates the sealing layer and the bank to expose a top surface of one of the second electrode and the second connection line and to expose a top surface of one of the 1-2 th connection line and the 1-2 th electrode, and wherein the layer in which the second connection line and the 1-2 th connection line are disposed is different from the layer in which the 1-2 th electrode and the second electrode are disposed.

2. The display device of claim 1, wherein the 1-1 th connection line has one side connected to the 1-1 th electrode, and another side connected to the one side electrode of the light-emitting element, wherein the second connection line has:

one of two sides connected to the another side electrode of the light-emitting element in the first area;

the other of the two sides disposed in the second area; and a middle portion disposed between the two sides and connected to the second electrode, and wherein the 1-2 th connection line has one side connected to the 1-2 th electrode in a same layer, and another side disposed in a different layer from a layer in which the one side thereof is disposed.

3. The display device of claim 1, wherein the 1-1 th connection line, the 1-2 th connection line, and the second connection line are made of a same material.

4. The display device of claim 1, wherein the display device comprises:

a substrate including the first area and the second area;

the 1-1 th electrode disposed on the substrate and in the first area;

the 1-2 th electrode disposed on the substrate and in the second area;

the second electrode disposed on the substrate and in a portion of the first area and a portion of the second area;

a first insulating layer disposed on the 1-1 th electrode, the second electrode, the 1-2 th electrode, and the substrate;

the light-emitting element disposed on the first insulating layer; and a second insulating layer disposed on the first insulating layer and the light-emitting element.

5. The display device of claim 4, wherein the display device further comprises:

the 1-1 th connection line disposed on the second insulating layer and having one side connected to the 1-1 th electrode via a contact-hole, and another side connected to the one side electrode of the light-emitting element via a contact-hole;

the second connection line disposed on the second insulating layer and having:

one of two sides connected to the another side electrode of the light-emitting element via a contact-hole;

the other of the two sides extending through the second insulating layer so as to be disposed on the first insulating layer; and a middle portion disposed between the two sides and connected to the second electrode via a contact-hole;

the 1-2 th connection line disposed on the second insulating layer and having one side connected to the 1-2 th electrode via a through-hole, and another side extending through the second insulating layer so as to be disposed on the first insulating layer;

the bank disposed on the 1-1 th connection line, the second connection line, the 1-2 th connection line, and the second insulating layer; and the sealing layer disposed on the bank, a portion of the 1-1 th connection line, a portion of the second connection line, and the second insulating layer.

6. The display device of claim 5, wherein the bank includes a black material.

7. The display device of claim 1, wherein the light-emitting element includes a micro light-emitting diode chip.

8. The display device of claim 7, wherein the light-emitting element includes:

a first semiconductor layer;

an active layer disposed on the first semiconductor layer; and a second semiconductor layer disposed on the active layer, wherein the one side electrode is disposed on the second semiconductor layer, while the another side electrode is disposed on the first semiconductor layer.

9. The display device of claim 4, wherein the substrate includes:

a base substrate;

a gate electrode disposed on the base substrate;

a gate insulating layer disposed on the base substrate and the gate electrode;

an active layer and a common power line disposed on the gate insulating layer;

a source electrode and a drain electrode disposed on the gate insulating layer and the active layer; and a planarization layer disposed on the gate insulating layer, the source electrode, the active layer, the drain electrode, and the common power line, wherein the 1-1 th electrode is connected to the source electrode via a source connection line as a contact-hole, and wherein the second electrode is connected to the common power line via a connection line as a contact-hole.

10. A display device comprising:

a substrate including a first area and a second area;

a first light-emitting element disposed in the first area;

a second light-emitting element disposed in the second area;

a 1-1 th electrode disposed on the substrate and in the first area;

a second electrode disposed on the substrate and in a portion of the first area and a portion of the second area;

a 1-2 th electrode disposed on the substrate and in the second area;

a 1-1 th connection line connecting one side electrode of the first light-emitting element and the 1-1 th electrode to each other;

a second connection line connecting the second electrode to another side electrode of the first light-emitting element, and connecting the second electrode to one side electrode of the second light-emitting element;

a 1-2 th connection line connecting the 1-2 th electrode and another side electrode of the second light-emitting element;

a bank disposed on the 1-1 th connection line, the second connection line, and the 1-2 th connection line; and a sealing layer disposed on the bank, a portion of the 1-1 th connection line, and a portion of the second connection line, wherein an opening hole in the second area penetrates the sealing layer and the bank to expose a top surface of one of the second electrode and the second connection line and to expose a top surface of one of the 1-2 th connection line and the 1-2 th electrode.

11. The display device of claim 10, wherein the one side electrode of the second light-emitting element is connected to the second connection line via a first conductive adhesive, and wherein the another side electrode of the second light-emitting element is connected to the 1-2 th connection line via a second conductive adhesive.

12. A display device comprising:

a substrate including a first area and a second area;

a first light-emitting element disposed in the first area;

a second light-emitting element disposed in the second area;

a 1-1 th electrode disposed on the substrate and in the first area;

a second electrode disposed on the substrate and in a portion of the first area and a portion of the second area;

a 1-2 th electrode disposed on the substrate and in the second area;

a 1-1 th connection line connecting one side electrode of the first light-emitting element and the 1-1 th electrode to each other;

a second connection line connecting another side electrode of the first light-emitting element and the second electrode to each other;

a 1-2 th connection line connected to the 1-2 th electrode;

a bank disposed on the 1-1 th connection line, the second connection line, and the 1-2 th connection line; and a sealing layer disposed on the bank, a portion of the 1-1 th connection line, and a portion of the second connection line, wherein an opening hole in the second area penetrates the sealing layer and the bank to expose a top surface of one of the second electrode and the second connection line and to expose a top surface of one of the 1-2 th connection line and the 1-2 th electrode, wherein one side electrode of the second light-emitting element is connected to the second electrode in the second area, and wherein another side electrode of the second light-emitting element is connected to the 1-2 th electrode in the second area.

13. The display device of claim 12, wherein the one side electrode of the second light-emitting element is connected to the second electrode via a first conductive adhesive, and wherein the another side electrode of the second light-emitting element is connected to the 1-2 th electrode via a second conductive adhesive.

14. A display device comprising:

a substrate including a first area and a second area;

a light-emitting element disposed in the first area;

a 1-1 th electrode disposed on the substrate and in the first area;

a second electrode disposed on the substrate and in a portion of the first area and a portion of the second area;

a 1-2 th electrode disposed on the substrate and in the second area;

a 1-1 th connection line connected to the 1-1 th electrode;

a second connection line connected to the second electrode; and a 1-2 th connection line connected to the 1-2 th electrode;

a bank disposed on the 1-1 th connection line, the second connection line, and the 1-2 th connection line; and a sealing layer disposed on the bank, a portion of the 1-1 th connection line, and a portion of the second connection line, wherein an opening hole in the second area penetrates the sealing layer and the bank to expose a top surface of one of the second electrode and the second connection line and to expose a top surface of one of the 1-2 th connection line and the 1-2 th electrode, and wherein one side electrode of the light-emitting element is connected to the 1-1 th electrode, while another side electrode of the light-emitting element is connected to the second electrode.

15. The display device of claim 14, wherein the one side electrode of the light-emitting element is connected to the 1-1 th electrode via a first conductive adhesive, wherein the another side electrode of the light-emitting element is connected to the second electrode via a second conductive adhesive.

16. The display device of claim 1, wherein the bank exposes the light-emitting element.

17. The display device of claim 1, further comprising a second light-emitting element disposed in the opening hole, wherein the light-emitting element and the second light-emitting element are disposed on different layers.

18. The display device of claim 17, wherein the second light-emitting element includes:

one side electrode connected to one of the 1-2 th connection line and the 1-2 th electrode; and another side electrode connected to one of the second electrode and the second connection line.

19. The display device of claim 1, further comprising:

a first insulating layer disposed on the 1-1 th electrode, the second electrode, and the 1-2 th electrode; and a second insulating layer disposed on the first insulating layer and the light-emitting element, wherein the opening hole further penetrates the second insulating layer to expose a top surface of the second connection line and a top surface of the 1-2 th connection line.

20. The display device of claim 1, further comprising:

a first insulating layer disposed on the 1-1 th electrode, the second electrode, and the 1-2 th electrode; and a second insulating layer disposed on the first insulating layer and the light-emitting element, wherein the opening hole further penetrates the first insulating layer and the second insulating layer to expose a top surface of the 1-2 th electrode and a top surface of the second electrode.

* * * * *